(12) United States Patent
Uemura

(10) Patent No.: US 7,235,769 B2
(45) Date of Patent: Jun. 26, 2007

(54) IMAGE READING APPARATUS HAVING ADJUSTABLE CONTACT SENSOR DISTANCE

(75) Inventor: Yoshiyuki Uemura, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 202 days.

(21) Appl. No.: 10/690,377

(22) Filed: Oct. 21, 2003

(65) Prior Publication Data

US 2004/0080614 A1 Apr. 29, 2004

Related U.S. Application Data

(62) Division of application No. 10/087,410, filed on Mar. 1, 2002, now abandoned.

(30) Foreign Application Priority Data

| Mar. 2, 2001 | (JP) | 2001-58302 |
| Nov. 22, 2001 | (JP) | 2001-356990 |
| Nov. 29, 2001 | (JP) | 2001-364100 |
| Dec. 11, 2001 | (JP) | 2001-376748 |

(51) Int. Cl.
H01L 27/00 (2006.01)
H04N 1/04 (2006.01)

(52) U.S. Cl. .................... 250/208.1; 358/474

(58) Field of Classification Search ............. 250/208.1, 250/201.2, 239; 358/474, 497
See application file for complete search history.

(56) References Cited

U.S. PATENT DOCUMENTS

| 5,362,958 A | * | 11/1994 | Ando | 250/208.1 |
| 5,610,731 A | * | 3/1997 | Itoh | 358/496 |
| 5,900,951 A | * | 5/1999 | Tsai | 358/497 |
| 5,986,774 A | | 11/1999 | Han | |
| 6,181,442 B1 | | 1/2001 | Ogura et al. | |
| 6,489,602 B1 | | 12/2002 | Wang et al. | |
| 6,801,343 B1 | * | 10/2004 | Sheng | 358/474 |

FOREIGN PATENT DOCUMENTS

| JP | 05-048787 | 2/1993 |
| JP | 06-205161 | 7/1994 |
| JP | 07-023176 | 1/1995 |
| JP | 07-327109 | * 12/1995 |

* cited by examiner

Primary Examiner—Thanh X. Luu
(74) Attorney, Agent, or Firm—RatnerPrestia

(57) ABSTRACT

An image reading apparatus includes a line light source having a light guide plate and red-, green-, and blue-LEDs, for a light transmitting original, and a contact image sensor unit for detecting light from the line light source. The light transmitting original is arranged between the line light source and the contact image sensor unit. The light transmitting original is read by moving the line light source and the contact image sensor unit relative to the light transmitting original. The line light source is moved interlockingly with the contact image sensor unit by the attraction between a magnet provided at both ends of the line light source in the longitudinal direction thereof and a magnet provided at both ends of the contact image sensor unit in the longitudinal direction thereof.

5 Claims, 28 Drawing Sheets

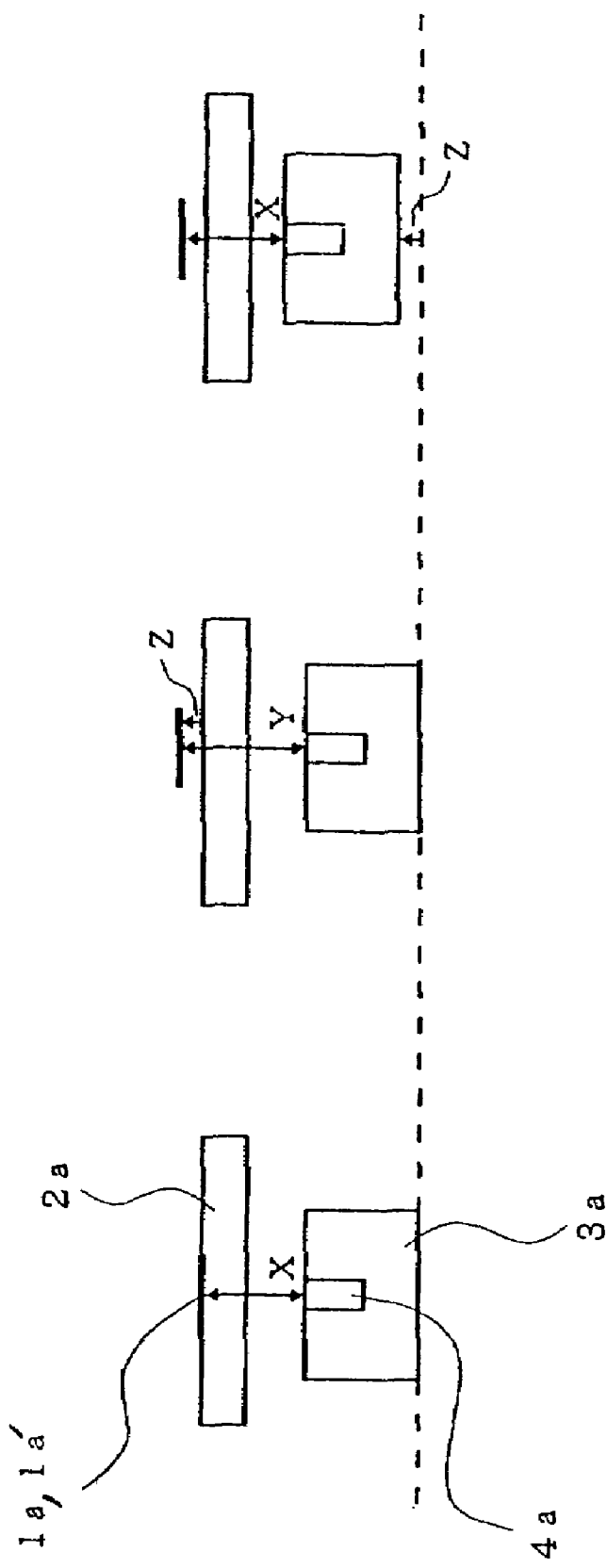

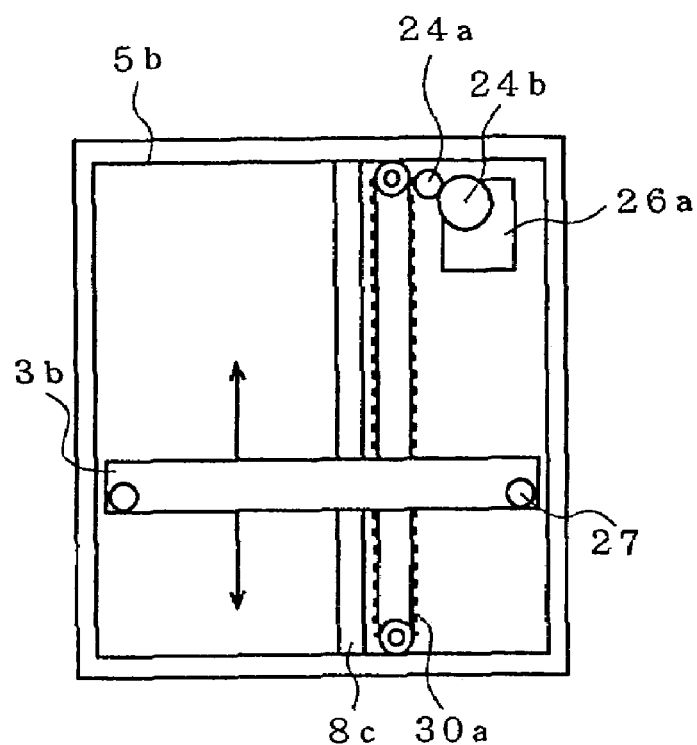
F I G. 5 A
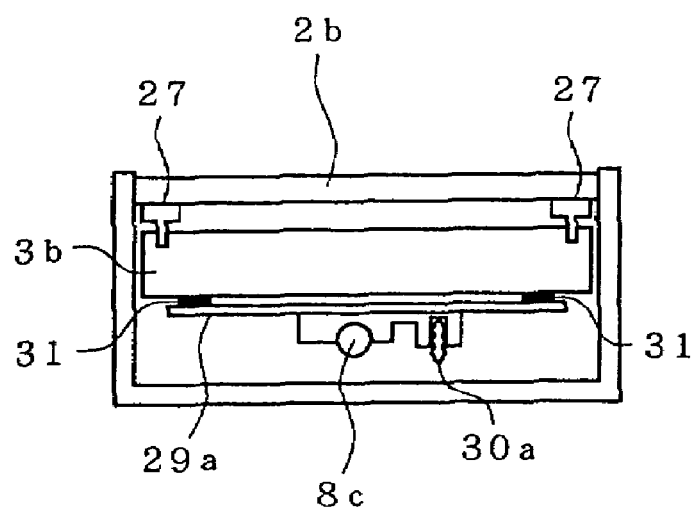
F I G. 5 B

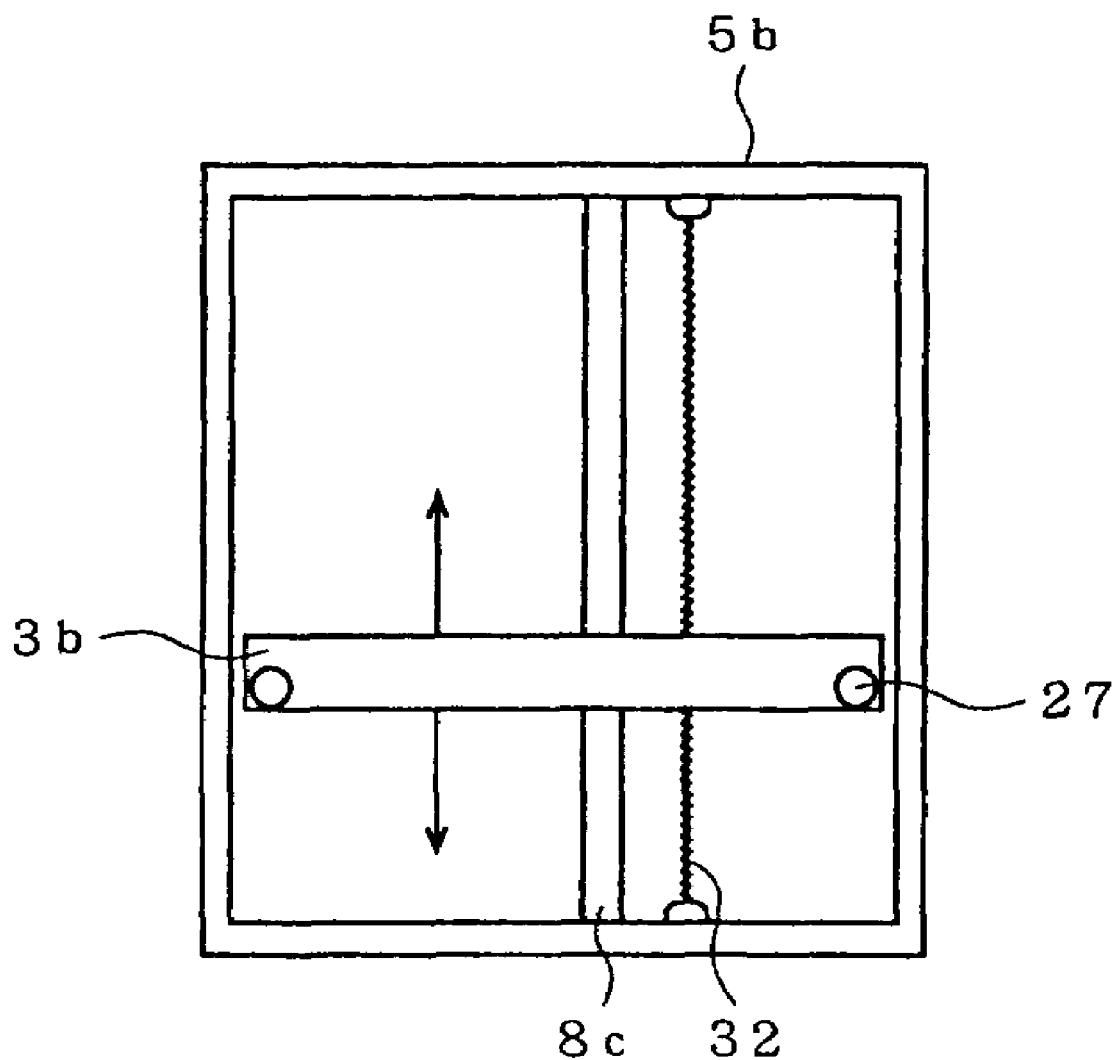
F I G . 6

(AFTER LIFTING)     (BEFORE LIFTING)

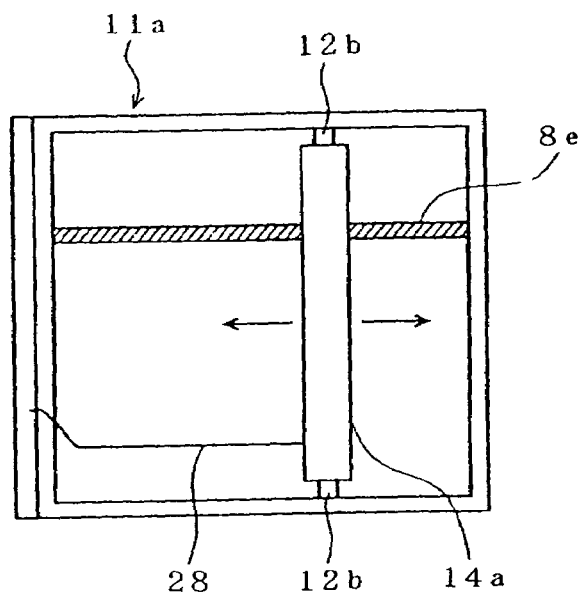
F I G . 1 1

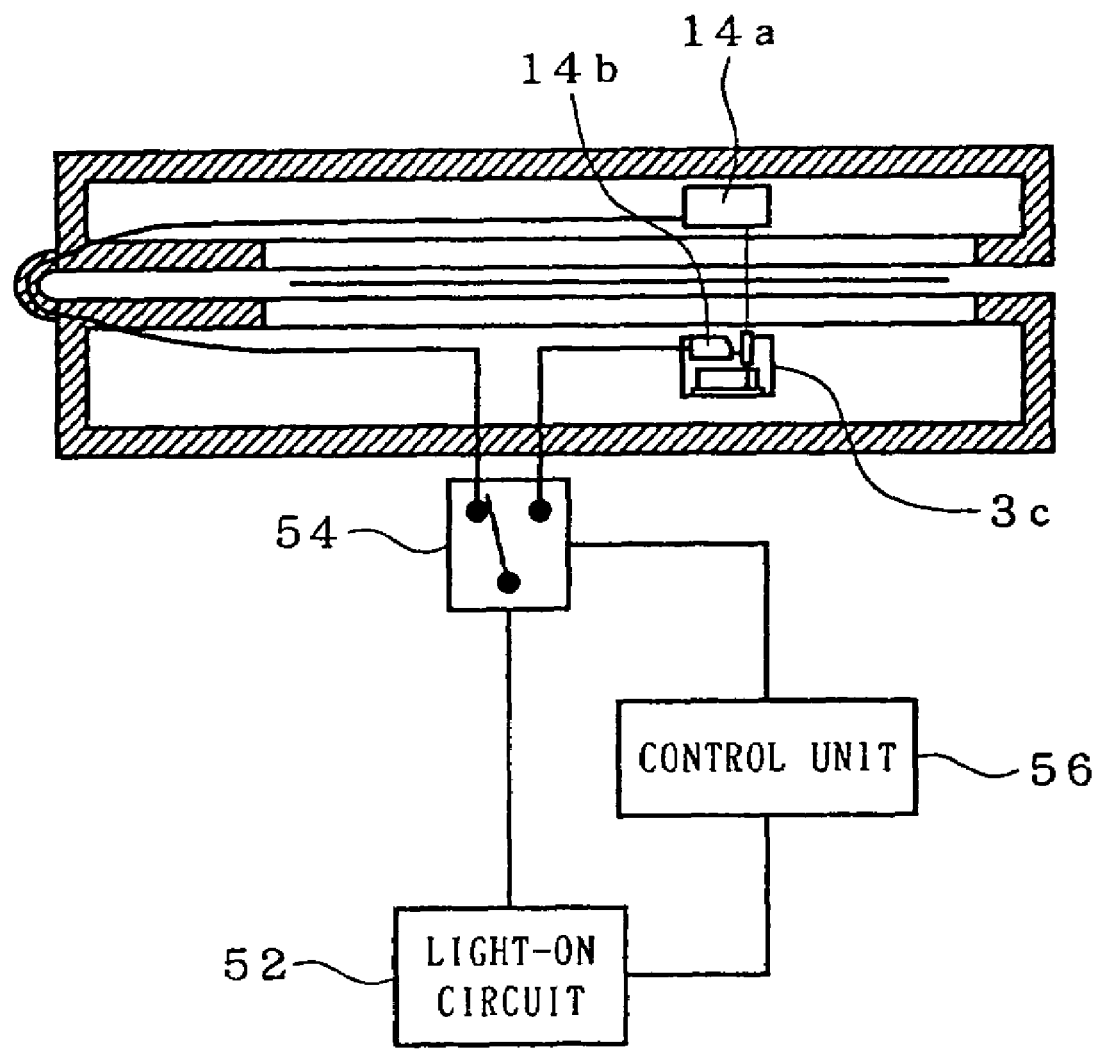
F I G . 1 3

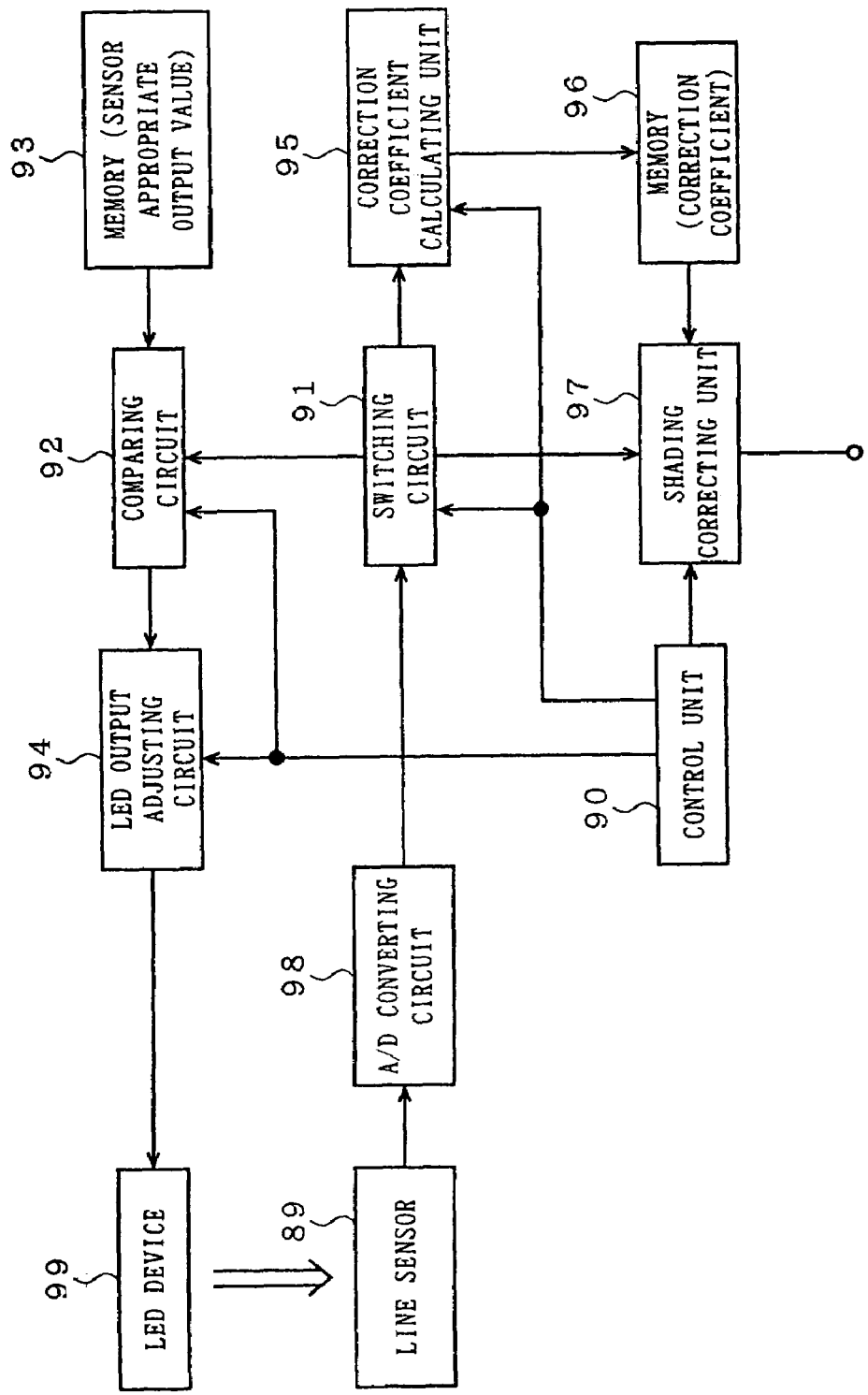
F I G. 1 6

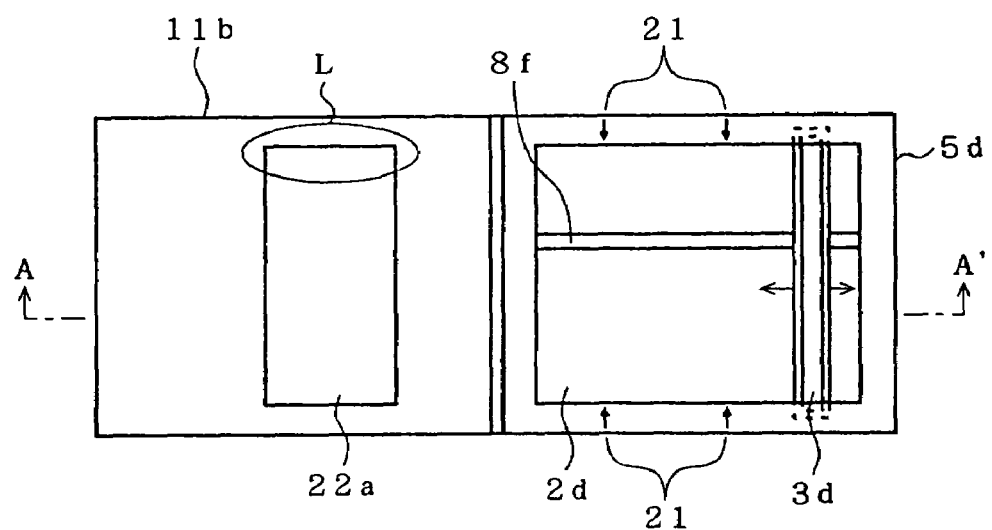
F I G. 1 7 A
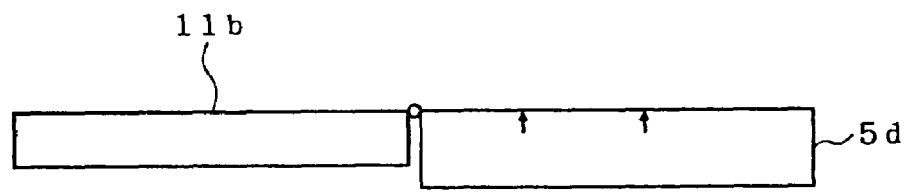
F I G. 1 7 B
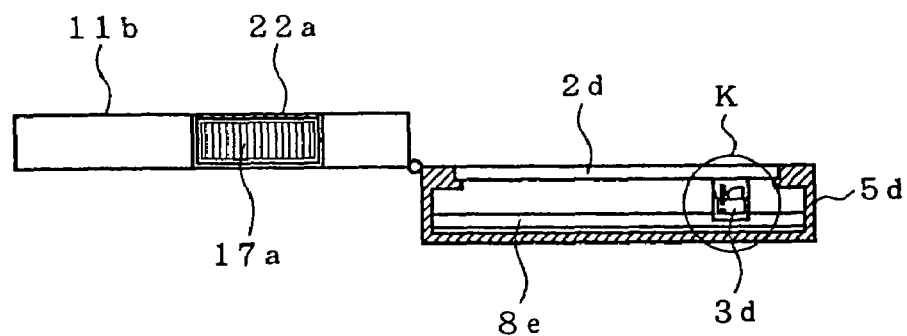
F I G. 1 7 C

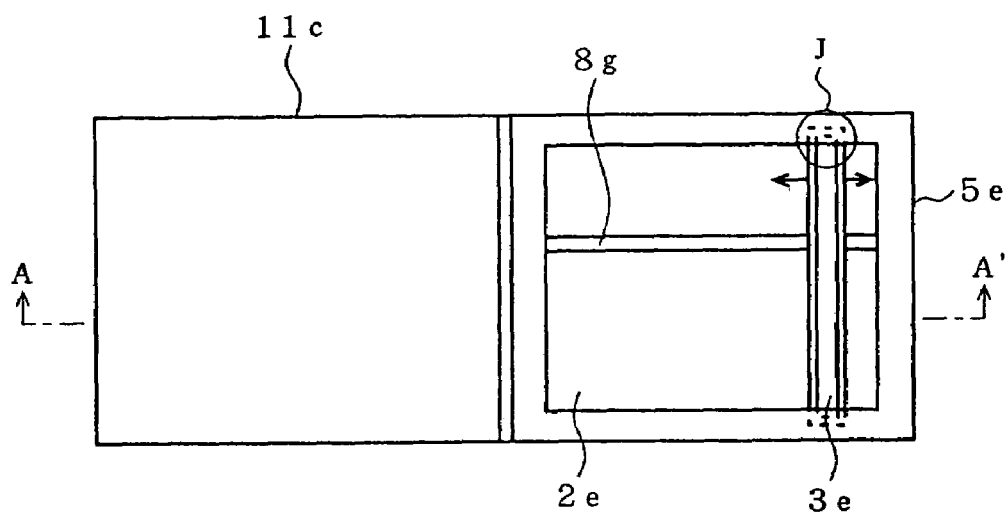
F I G . 2 0 A
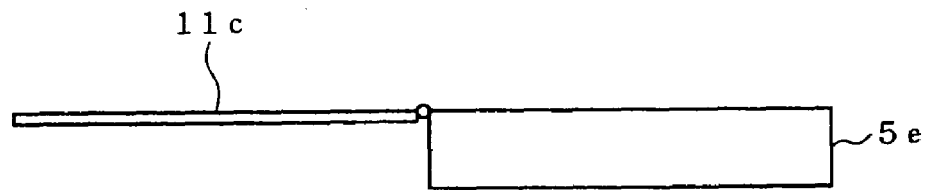
F I G . 2 0 B
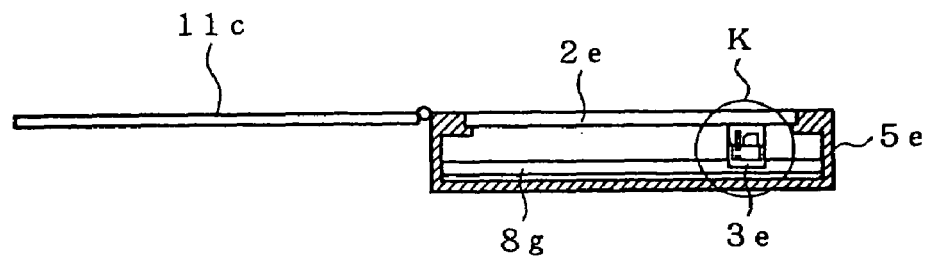
F I G . 2 0 C

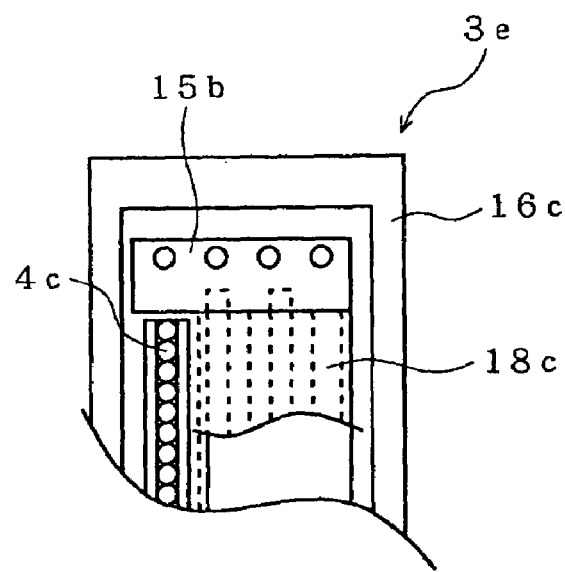
F I G. 2 1
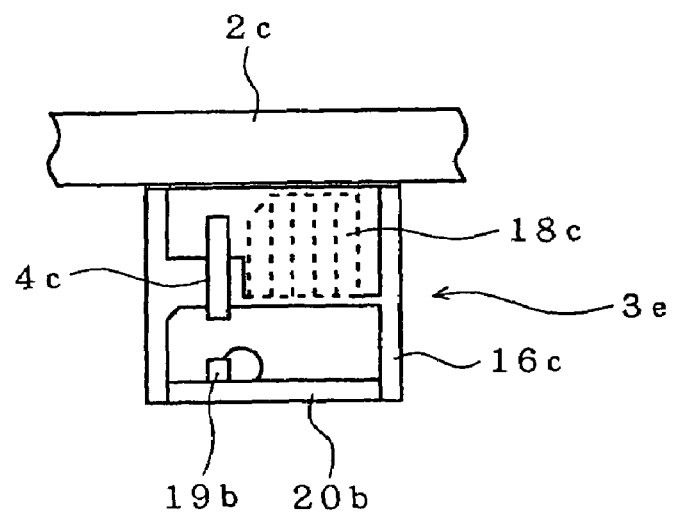
F I G. 2 2

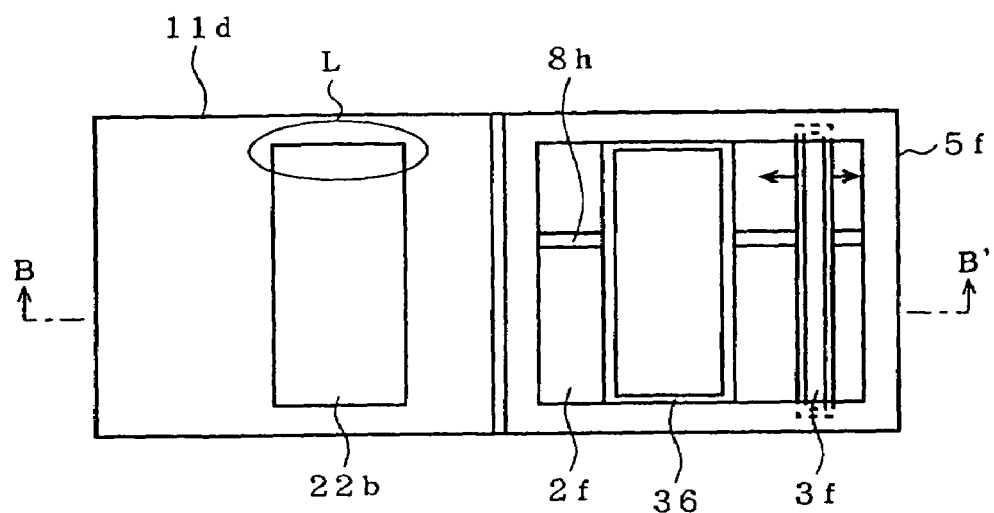
F I G. 2 3 A
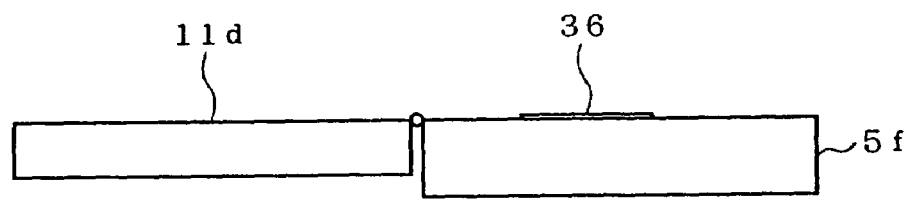
F I G. 2 3 B
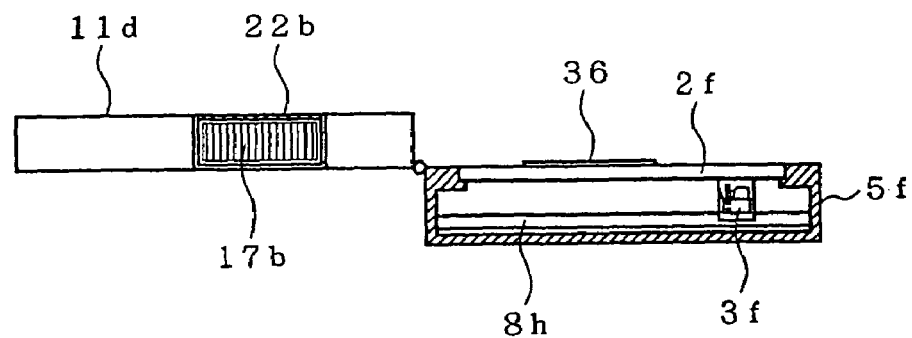
F I G. 2 3 C

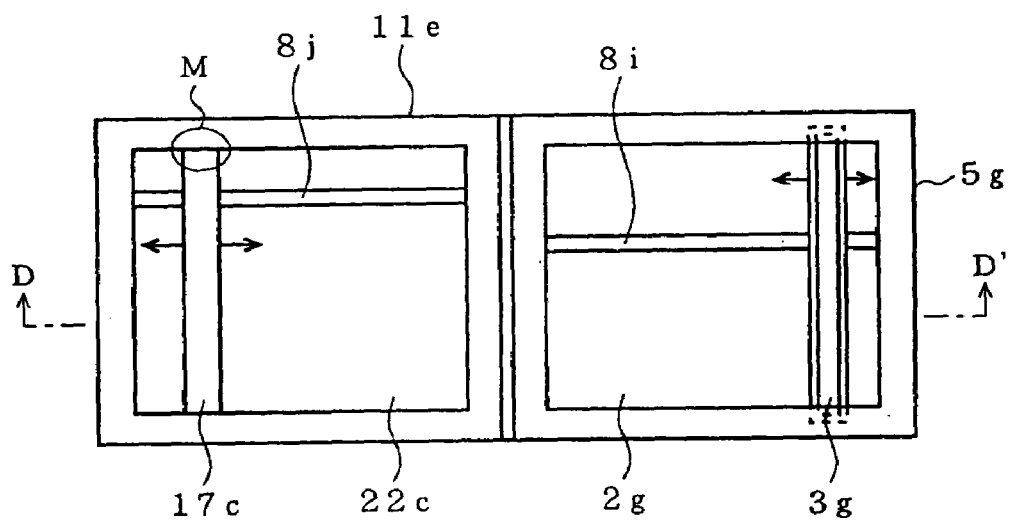
F I G. 2 5 A
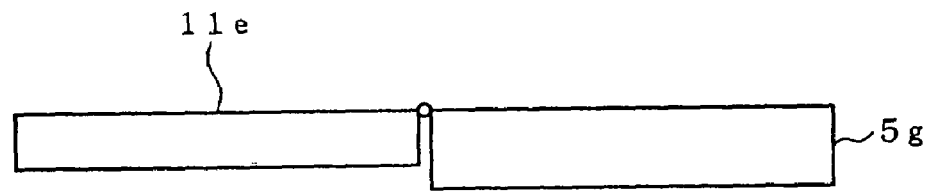
F I G. 2 5 B
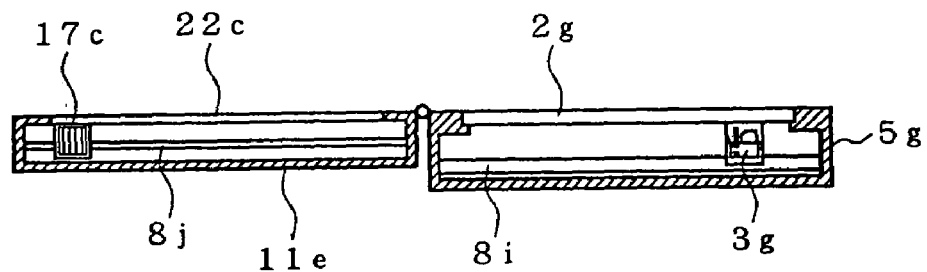
F I G. 2 5 C

IMAGE READING APPARATUS HAVING ADJUSTABLE CONTACT SENSOR DISTANCE

This application is a divisional of U.S. patent application Ser. No. 10/087,410, filed Mar. 1, 2002 now abandoned.

BACKGROUND OF THE INVENTION

1. Field of the Invention

The present invention relates to an image reading apparatus for a contact image sensor (CIS) type and, more particularly, to a CIS-type image reading apparatus for reading an image of a light transmitting original such as a film.

2. Description of the Related Art

Mainly, there are widely-used image reading apparatuses for reading an original of: one using a CCD sensor and one using a contact image sensor unit.

In general, the image reading apparatus using the CCD sensor reads an image by employing a white light source, separating reflection light from an original into three colors of red (R), green (G), and blue (B) by a color filter, and detecting the color light by a sensor.

Meanwhile, in general, the image reading apparatus using the contact image sensor unit reads an image by switching and lighting on three-color LED light sources consisting of red (R), green (G), and blue (B) LED ones in the contact image sensor unit and by detecting reflection light from an original by a sensor. As compared with the image reading apparatus using the CCD sensor, usually, the image reading apparatus using the contact image sensor unit has a shorter length of an optical path, advantageously, equipment thereof can be thus reduced in size (be thinner) and troublesome optical adjustment is not needed. In place of the image reading apparatus using the CCD sensor, the image reading apparatus using the contact image sensor unit is widely used.

In the case of reading both a sheet original (reflecting sheet) and a light transmitting original such as a negative film, a positive film, or a slide, the image reading apparatus using the CCD sensor may comprise a white light source upstream of the original and can relatively easily read both the sheet original and the light transmitting original. Since a focusing depth is enough to read the light transmitting original, it is possible to set the light transmitting original on an original base without taking so care of the height from the original base made of a glass plate.

On the contrary, in the case of reading both the sheet original and the light transmitting original, the image reading apparatus using the contact image sensor unit requires light sources capable of sequentially switching three R-, G-, and B-colors upstream of the original. Advantageously, the image reading apparatus using the contact image sensor unit can be made thinner and can reduce consumption power as compared with one using the CCD sensor. However, the image reading apparatus using the contact image sensor unit has a focusing position of a lens, which is set on the glass-plate forming the original base, and has a short focusing depth of the lens and, therefore, the operation for reading the light transmitting original requires the accurate setting of the light transmitting original at the height position similar to that of the general sheet original.

FIG. 1 is a diagram showing one example of an image reading apparatus of a contact image sensor type for reading a light transmitting original. Referring to FIG. 1, the image reading apparatus of the contact image sensor type comprises a contact image sensor (CIS) unit 61 in a main body 62. A top surface of the main body 62 comprises an original base 63 made of a glass plate. The contact image sensor unit 61 is arranged in the proximity of the glass plate. A light transmitting original 64 is placed onto the original base 63. A area light source 65 is provided upstream of the original base 63, and comprises a light guide plate and LEDs for sequentially emitting three light of red (R)-, green (G)-, and blue (B). The area light source 65 is incorporated in an original cover (not shown) or is replaced with the original cover upon reading the light transmitting original 64.

Light outputted from the area light source 65 is transmitted to the light transmitting original 64 and is detected by a line sensor via a rod lens array in the contact image sensor unit 61, thus to read the light transmitting original 64.

As mentioned above, the image reading apparatus of the contact image sensor type has the focusing position of the lens onto the glass surface of the original base and the shorter focusing depth of the lens and, therefore, even when the original surface is slightly separated from the glass surface, the lens is not focused to the original surface.

Accordingly, by providing another area light source for reading the light transmitting original for the CIS-type image reading apparatus, the negative film or the positive film, as the light transmitting original, can directly be set onto the glass surface of the original base and be read with a preferable resolution.

However, when the negative film or the positive film, as the light transmitting original, has a holding frame such as a slide frame, a distance from the glass surface of the original base to the original surface varies depending on the presence or absence of the holding frame. Therefore, inconveniently, the lens is not focused to the original surface and the resolution deteriorates.

Differently from the image reading apparatus of the CCD sensor type, the image reading apparatus of the contact image sensor type for sequentially switching the three R-, G-, and B-LED light sources and reading the original cannot read the light transmitting original only by setting the white light source onto the original and lighting on it, and needs the arrangement at the top of the original, of a area light source comprising a light guide plate and R-, G-, B-LED light sources capable of being sequentially switched.

However, since the area light source comprising the light guide plate and the R-, G-, and B-LED light sources has an illuminance which is reduced as it exists more apart from the R-, G-, and B-LED light sources, it is not possible to manufacture the area light source having a uniform illuminance over a wide area. Consequently, the area light source comprising the light guide plate and the R-, G-, and B-LED light sources cannot read the light transmitting original having a wide area.

Further, as mentioned above, since the image reading apparatus of the contact image sensor type has the focusing position which is set onto the glass surface of the original base and has the short focusing depth, the reading of the light transmitting original requires the setting of the light transmitting original onto the glass surface of the original base similarly to the sheet original. However, when the light transmitting original such as a polyester-system film is placed onto the glass surface of the original base similarly to the sheet original, it is adhered to the glass surface, resulting in a problem in that a Newton ring is caused and an image to be captured has a poor quality.

In the image reading apparatus of the CCD sensor type, a readable wavelength is limited because the white light source is used. Thus, there is a problem in that it is not possible to read the light transmitting original and the sheet original having information capable of being read by light except for visible light, such as secret information or a discrimination mark which is not visible with the naked eye. Although the image reading apparatus of the CCD sensor type can be applied to a visible-light region, the operation for irradiating the light other than the visible light and reading the original needs the replacement of the light source for reading the original, using the light other than the visible light, every time.

Upon reading an original which mixedly includes the light transmitting original and the sheet original (e.g., reading a picture including a transparent region), currently, the image reading apparatus of the CCD sensor type has a problem in that it takes long time to read the original because transmission light and reflection light are separately read.

SUMMARY OF THE INVENTION

It is one object of the present invention to provide an image reading apparatus of a contact image sensor type in which a resolution can be maintained even if changing a distance from a glass surface of an original base to an original surface of a light transmitting original.

Further, it is another object of the present invention to provide an image reading apparatus of a contact image sensor type for reading an image of a light transmitting original with a wide area.

Furthermore, it is another object of the present invention to provide an image reading apparatus of a contact image sensor type, for capturing a light transmitting original without a Newton ring.

In addition, it is another object of the present invention to provide an image reading apparatus of a contact image sensor type, for preferably reading an original having information which can be read by visible light and light except therefor.

According to a first aspect of the present invention, there is provided an image reading apparatus of a contact image sensor type for reading a light transmitting original by moving a contact image sensor unit on a guide rail, wherein a distance from an original surface of the light transmitting original to the contact image sensor unit is adjusted by changing a position of a surface of the guide rail on which the contact image sensor unit moves or by providing a lifting mechanism between the guide rail and the contact image sensor unit and, thus, a resolution is held.

According to a second aspect of the present invention, there is provided an image reading apparatus comprising: a first line-light-source for irradiating a light transmitting original; and a line sensor for receiving transmission light from the light transmitting original irradiated by the first line-light-source, wherein the light transmitting original is arranged between the first line-light-source and the line sensor, said first line-light-source and said line sensor are moved relative to the light transmitting original, and the light transmitting original is thus read.

According to a third aspect of the present invention, there is provided an image reading apparatus of a contact image sensor type having a area light source, for reading a light transmitting original placed on an original base by irradiating light thereto from the area light source and receiving transmission light, wherein the original base has an uneven portion on a front surface on the side on which the light transmitting original is placed without effect to optical characteristics for reading the light transmitting original so that the adhesion of the light transmitting original to the original base is prevented upon placing the light transmitting original on the original base.

According to a fourth aspect of the present invention, there is provided an image reading apparatus comprising: a line light source for emitting visible light and/or light other than the visible light and irradiating the light to an original; and a line sensor having the sensitivity to the visible light and/or the light other than the visible light, for receiving reflection light from the original irradiated by the line light source, wherein the original having information capable of being read by the visible light and/or the light other than the visible light is read by moving the line light source and the line sensor relative to the original, by irradiating the visible light and/or the light other than the visible light from the line light source except for when the line sensor receives the visible light irradiated by the line light source from the original, and by receiving the visible light and/or the light other than the visible light by the line sensor.

BRIEF DESCRIPTION OF THE DRAWINGS

FIG. 2A is a schematic diagram showing one relationship between the light transmitting original and a contact image sensor (CIS) unit according to a first embodiment of the present invention;

FIG. 2B is a schematic diagram showing another relationship between the light transmitting original and the contact image sensor (CIS) unit according to the first embodiment;

FIG. 2C is a schematic diagram showing another relationship between the light transmitting original and the contact image sensor (CIS) unit according to the first embodiment;

FIG. 5A is a plan view of another example of the image reading apparatus according to the first embodiment;

FIG. 5B is a side cross-sectional view of the image reading apparatus according to the first embodiment;

FIG. 6 is a plan view of the image reading apparatus upon using a wire according to the first embodiment;

FIG. 11 is a plan view of an original cover in view of the original-reading side according to the second embodiment;

FIG. 12 is a cross-sectional view of a contact image sensor unit disclosed in Japanese Unexamined Patent Application Publication No. 10-126581;

FIG. 13 is a diagram of the configuration of a circuit for lighting on a light source for a light transmitting original and a light source for a sheet original according to the second embodiment;

FIG. 16 is a diagram showing one example of the constitution of a shading correcting device used for the image reading apparatus according to the second embodiment;

FIG. 17A is a plan view of an image reading apparatus for reading images of both a light transmitting original and a sheet original when an original cover is opened according to a third embodiment of the present invention;

FIG. 17B is a side view of the image reading apparatus when the original cover is opened according to the third embodiment;

FIG. 17C is a sectional-view of the image reading apparatus along an A–A' line of FIG. 17A according to the third embodiment;

FIG. 20A is a plan view of an image reading apparatus for reading a sheet original when an original cover is opened according to a fourth embodiment of the present invention;

FIG. 20B is a side view of the image reading apparatus when the original cover is opened according to the fourth embodiment;

FIG. 20C is a cross-sectional view of the image reading apparatus along an A–A' line of FIG. 20A according to the fourth embodiment;

FIG. 21 is a partially plan view of an enlarged J-portion shown in FIG. 20A according to the fourth embodiment;

FIG. 22 is a cross-sectional view of an enlarged K-portion shown in FIG. 20C according to the fourth embodiment;

FIG. 23A is a plan view of an image reading apparatus for reading images of a sheet original, a light transmitting original, and a watermarked original when the original cover is opened according to the fourth embodiment;

FIG. 23B is a side view of the image reading apparatus when the original cover is opened according to the fourth embodiment;

FIG. 23C is a cross-sectional view of the image reading apparatus along a B–B' line of FIG. 23A according to the fourth embodiment;

FIG. 25A is a plan view of an image reading apparatus for reading the images of the sheet original, the light transmitting original, and the watermarked original when the original cover is opened according to a modification of the fourth embodiment;

FIG. 25B is a side view of the image reading apparatus when the original cover is opened according to the modification of the fourth embodiment;

FIG. 25C is a cross-sectional view along a D–D' line of FIG. 25A according to the modification of the fourth embodiment;

DESCRIPTION OF THE PREFERRED EMBODIMENTS

Hereinbelow, a first embodiment of the present invention will be described with reference to the drawings.

FIGS. 2A to 2C are schematic diagrams showing relationships between a light transmitting original and a contact image sensor (CIS) unit in a CIS-type image reading apparatus in the present invention.

Referring to FIG. 2A, an original surface of a light transmitting original la is adhered to a glass surface of an original base 2a and a lens is focused to the original surface. In this case, symbol X denotes a distance from the original surface to an incident side surface of a rod lens array 4a.

Referring to FIG. 2B, the original surface is apart from the glass surface of the original base 2a by a distance Z so that the light transmitting original la has a slide frame, and symbol Y denotes a distance from the original surface to the incident side surface of the rod lens array 4a. In this case, an equality of (Y=X+Z) is established.

As described above, in the CIS-type image reading apparatus, the lens is focused to the glass surface of the original base 2a and the focusing depth of the lens is short. Therefore, if the original surface is apart from the glass surface of the original base 2a by the distance Z, the lens is not focused to the original surface. Then, referring to FIG. 2C, the distance X from the original surface to the rod lens array 4a is maintained and the lens can be focused to the original surface by moving the overall contact image sensor unit 3a in the direction of the original surface by the distance Z. An adjusting range of the distance is several mm or, sufficiently, 10 mm or less at the maximum level because the slide frame is a target. A resolution is not sufficiently reduced as long as the accuracy of the distance is approximately 0.1 mm.

General image reading apparatuses use a method for scanning the original surface by placing the contact image sensor unit on a guide rail and moving the contact image sensor unit onto the guide rail by a driving mechanism. Then, the following mechanisms for adjusting the distance from the original surface to the contact image sensor unit are exemplified.

Figure 1:
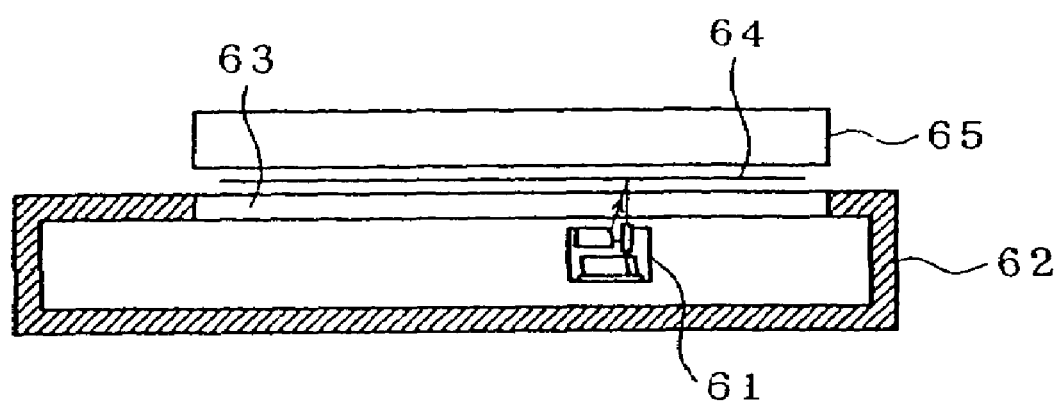
FIG. 1 is a block diagram showing one example of an image reading apparatus of a contact image sensor type for reading a light transmitting original.
Figure 3A:
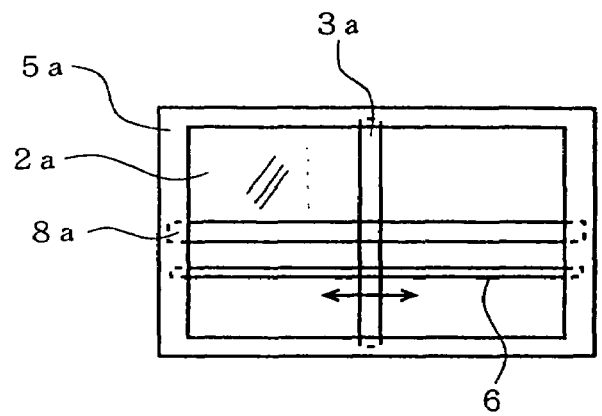
FIG. 3A is a plan view of one example of the image reading apparatus according to the first embodiment.
Figure 3B:
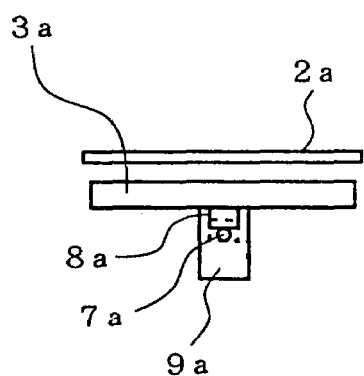
FIG. 3B is a diagram showing one portion for adjusting a distance from an original surface to the contact image sensor unit in side view according to the first embodiment.
Figure 3C:
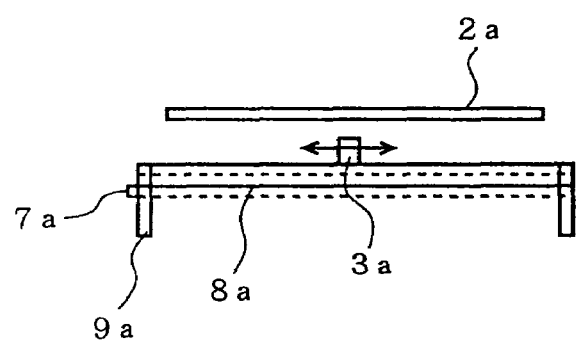
FIG. 3C is a diagram showing one portion for adjusting the distance from the original surface to the contact image sensor unit in front view according to the first embodiment.

FIGS. 3A to 3C are conceptual diagrams for explaining a method for adjusting the distance from the original surface to the contact image sensor unit by changing a position of the surface of the guide rail. FIG. 3A is a plan view of the image reading apparatus. Referring to FIG. 3A, the image reading apparatus comprises a guide rail 8a onto which the contact image sensor unit 3a is moved, in the center of the main body 5a in the longitudinal direction thereof. Further, the image reading apparatus comprises a driving mechanism 6 for driving the contact image sensor unit 3a along the guide rail 8a.

FIG. 3B is a diagram showing one portion for adjusting the distance from the original surface to the contact image sensor unit in side view, and FIG. 3C is a diagram showing one portion for adjusting the distance from the original surface to the contact image sensor unit in front view.

A supporting portion 9a at both ends of the guide rail 8a comprises an adjusting mechanism 7a for varying the position of the surface of the guide rail 8a and adjusting the distance from the original surface to the contact image sensor unit 3a.

Figure 4A:
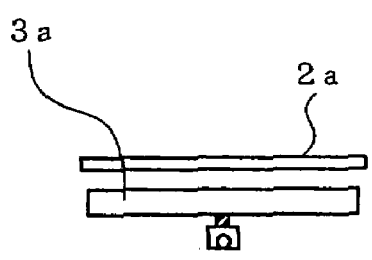
FIG. 4A is a diagram showing another portion for adjusting the distance from the original surface to the contact image sensor unit in side view according to the first embodiment.
Figure 4B:
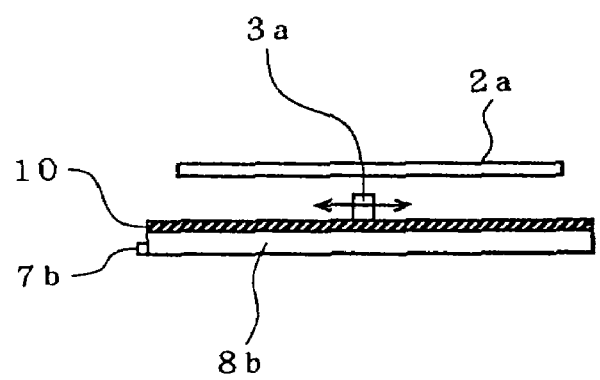
FIG. 4B is a diagram showing another portion for adjusting the distance from the original surface to the contact image sensor unit in front view according to the first embodiment.

FIGS. 4A and 4B are conceptual diagrams for explaining the method for arranging the distance from the original surface to the contact image sensor unit by making the position of the guide rail constant and providing a projecting portion, as a lifting mechanism, between the guide rail and the contact image sensor unit. FIG. 4A is a diagram showing another portion for adjusting the distance from the original surface to the contact image sensor unit in side view, and FIG. 4B is a diagram showing another portion for adjusting the distance from the original surface to the contact image sensor unit in front view.

A notch-type projecting portion 10 for lifting the contact image sensor unit 3a is provided on a guide rail 8b. The distance from the original surface to the contact image sensor unit 3a is controlled by adjusting the height of the projecting portion 10 by use of an adjusting mechanism 7b provided at both ends of the guide rail 8b.

Next, the mechanism for changing the distance from the original surface to the contact image sensor unit will specifically be described.

First, a mechanism for moving the contact image sensor unit will be described. FIG. 5A is a plan view of the image reading apparatus, and FIG. 5B is a side cross-sectional view of the image reading apparatus. Referring to FIG. 5A, a main body 5b of the image reading apparatus comprises therein a contact image sensor unit 3b, a guide rail 8c, a belt 30a, gears 24a and 24b, and a driving motor 26a. The belt 30a is driven by the driving motor 26a via the gears 24a and 24b. The contact image sensor unit 3b is driven by the belt 30a, thus to slide onto the guide rail 8c.

Referring to FIG. 5B, a section of the guide rail 8c is circular-shaped. A supporting plate 29a comprises a concave portion which is semicircular-shaped along the guide rail 8c. No mechanism for engaging the supporting plate 29a with the guide rail 8c is provided. Pins 27 for keeping a distance from an original base 2b to the contact image sensor unit 3b constant are fixed onto the contact image sensor unit 3b. In order to keep the contact image sensor unit 3b in parallel with the original base 2b, the contact image sensor unit 3b is lifted up by springs 31 provided on the supporting plate 29a.

FIG. 6 is a plan view of the image reading apparatus upon using a wire in place of the belt. Referring to FIG. 6, a wire 32 has a spiral groove on the surface thereof. This groove is engaged with a spiral groove formed in a hole of the supporting plate 29a and then the wire 32 is rotated, thereby driving the contact image sensor unit 3b.

Figure 7A:
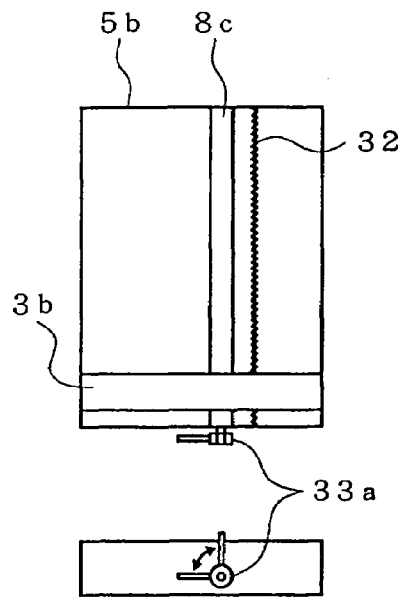
FIG. 7A is a plan view and a side view showing one specific example of a method for adjusting the distance from the original surface to the contact image sensor unit according to the first embodiment.
Figure 7B:
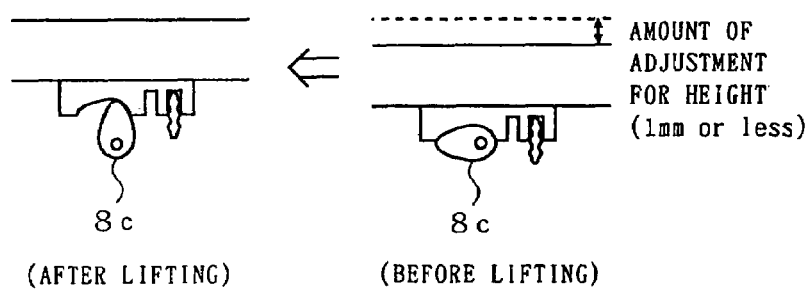
FIG. 7B is a conceptual diagram of one mechanism for adjusting the distance from the original surface to the contact image sensor unit according to the first embodiment.

FIG. 7A is a plan view and a side view showing one specific example of the method for adjusting the distance from the original surface to the contact image sensor unit by changing a surface position of the guide rail, and FIG. 7B is a conceptual diagram of one mechanism for adjusting the distance from the original surface to the contact image sensor unit.

Referring to FIGS. 7A and 7B, a cam mechanism is exemplified. A section of the guide rail 8c is oval-shaped and is used as a cam. Since the adjusted distance may be approximately 1 mm, the oval-shaped section of the guide rail 8c does not need to be deformed. The distance is adjusted by rotating the guide rail 8c by use of a lever 33a and then changing the surface position of the guide rail 8c.

Although the surface position of the guide rail can continuously be changed, it may stepwise be changed. For example, only high and low positions of the surface may be switched. Two-step switching, etc. requires a stopper at the lever 33a to prevent the guide rail 8c from being rotated more than needs.

Referring to FIG. 5B, the distance from the original surface to the contact image sensor unit cannot be adjusted by fixing the pins 27 for holding the contact image sensor unit 3b. Then, the distance from the original base 2b to the contact image sensor unit 3b can be changed by fixing the distance from the supporting plate 29a to the contact image sensor unit 3b and inserting springs under the pins 27.

Figure 8A:
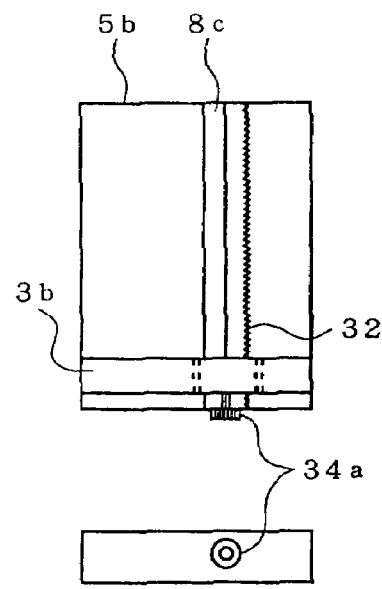
FIG. 8A is a plan view and a side view showing another specific example of the method for adjusting the distance from the original surface to the contact image sensor unit according to the first embodiment.
Figure 8B:
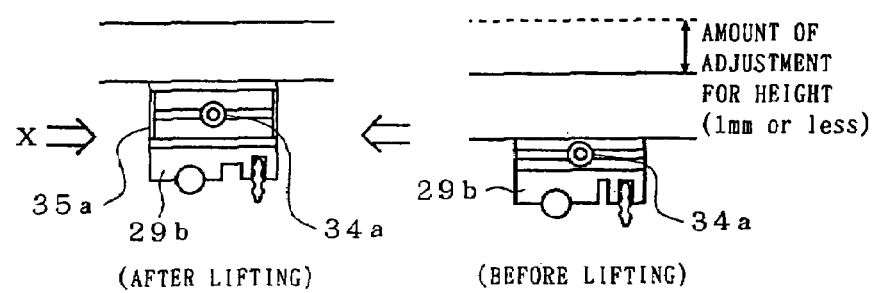
FIG. 8B is a conceptual diagram of another mechanism for adjusting the distance from the original surface to the contact image sensor unit according to the first embodiment.
Figure 8C:
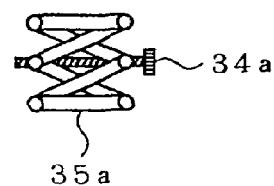
FIG. 8C is a diagram of a jack in an X-direction of FIG. 8B according to the first embodiment.

FIG. 8A is a plan view and a side view showing another specific example of the method for adjusting the distance from the original surface to the contact image sensor unit by providing the lifting mechanism between the guide rail and the contact image sensor unit, FIG. 8B is a conceptual diagram of another mechanism for adjusting the distance, and FIG. 8C is a diagram of a jack in an X-direction of FIG. 8B.

Referring to FIGS. 8A to 8C, a jack mechanism using the rotation of a screw is exemplified. A jack 35a is inserted between a supporting plate 29b and the contact image sensor unit 3b and lifting the contact image sensor unit 3b by the rotation of the screw which is caused by rotating a knob 34a. Although the height of the contact image sensor unit can continuously be changed, it may stepwise be changed. For example, only high and low heights of the contact image sensor unit may be switched. Two-step switching, etc. requires a stopper to prevent the screw from being rotated more than needs.

General image reading apparatuses can read both the sheet original and the light transmitting original. As shown in FIG. 2A, the CIS-type image reading apparatus reads both a sheet original 1a' and the light transmitting original 1a. The CIS-type image reading apparatus uses light sources different depending on the sheet original 1a' and the light transmitting original 1a. Therefore, the CIS-type image reading apparatus can employ the aforementioned adjusting mechanisms if the change of the type of originals needs positional change of the contact image sensor unit.

Next, a second embodiment of the present invention will be described with reference to the drawings.

Figure 9:
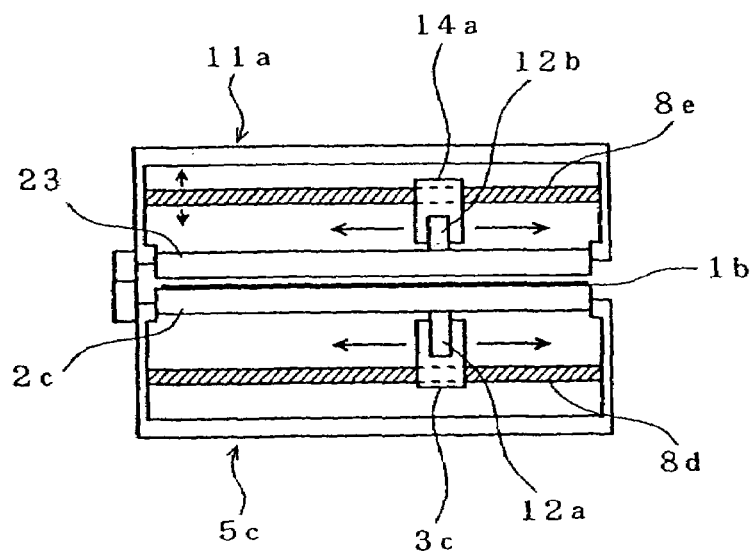
FIG. 9 is a cross-sectional view showing an image reading apparatus according to a second embodiment of the present invention.

FIG. 9 is a cross-sectional view showing an image reading apparatus according to the second embodiment of the present invention. Referring to FIG. 9, the image reading apparatus comprises a main body 5c and an original cover 11a which can openably and closably be supported to the main body 5c. The main body 5c comprises a contact image sensor unit 3c which is longitudinal in a main scanning direction, and a guide rail 8d for guiding the contact image sensor unit 3c in a sub-scanning direction (perpendicular to the main scanning direction). The top of the main body 5c comprises an original base 2c made of a glass plate. The contact image sensor unit 3c provided in the proximity of the glass plate of the original base 2c, comprises therein a line sensor for receiving transmission light from a light transmitting original 1b and a magnet 12a at both ends in the longitudinal direction thereof.

The original cover 11a having a cover glass 23 is arranged upstream of the original base 2c. The light transmitting original 1b is placed on the original base 2c and is covered by the original cover 11a.

The original cover 11a comprises therein a line light source 14a for the light transmitting original which is longitudinal in the main scanning direction, and a guide rail 8e for guiding the line light source 14a for the light transmitting sheet in the sub-scanning direction. The line light source 14a for the light transmitting original is a stick-shaped light source comprising a light guide plate and LEDs for emitting three color light of red (R), green (G), and blue (B). Further, the line light source 14a for the light transmitting sheet comprises a magnet 12b at both ends thereof in the longitudinal direction, and is arranged in the proximity of the glass surface of the cover glass 23 for covering so that the light is outputted in a direction of the contact image sensor unit 3c.

Figure 10:
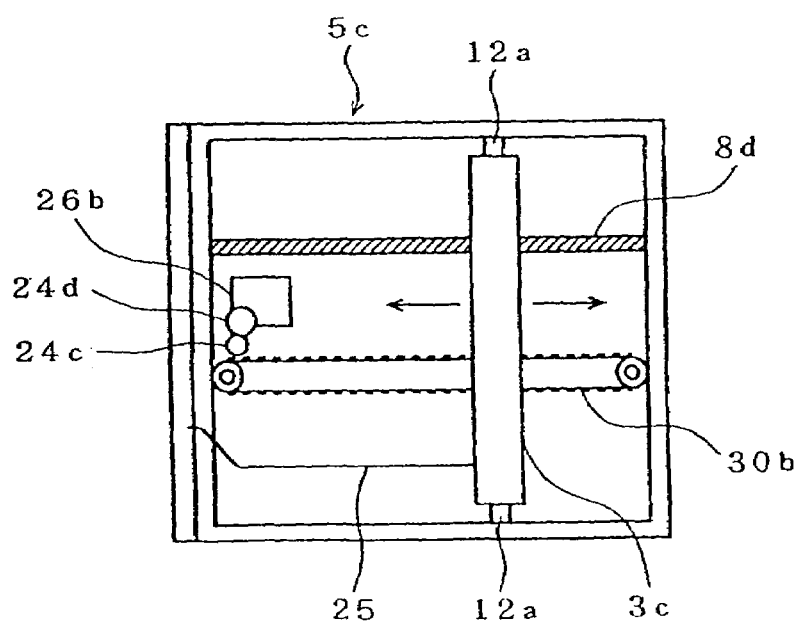
FIG. 10 is a plan view of a main body of the image reading apparatus in view of an original-reading side according to the second embodiment.
Figure 1:
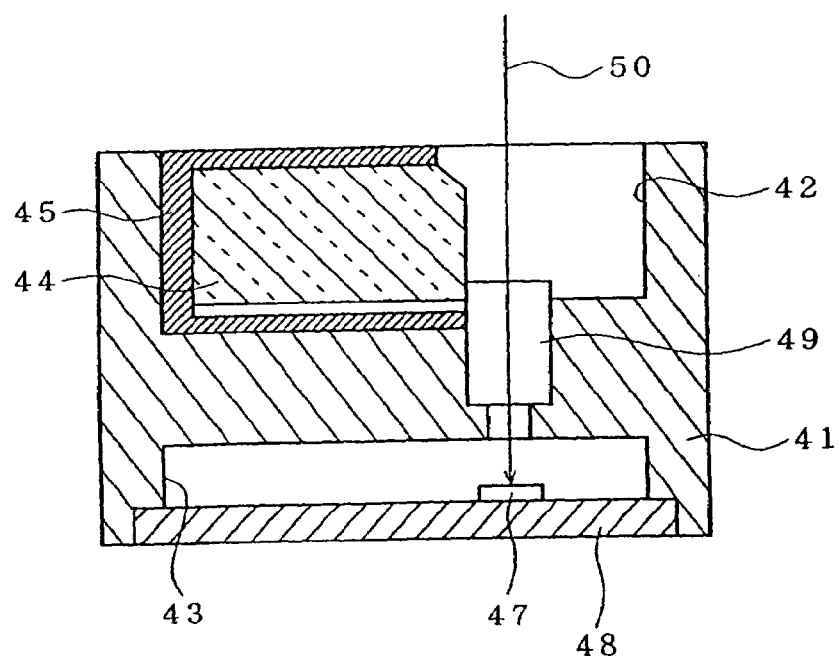

FIG. 10 is a plan view of a main body of the image reading apparatus in view of the original-reading side. A main body 5c comprises therein: a contact image sensor unit 3c for which the magnet 12a is provided at both ends thereof; and a guide rail 8d for guiding the contact image sensor unit 3c in the sub-scanning direction. Although not shown in FIG. 9, the main body 5c further comprises: a belt 30b for moving the contact image sensor unit 3c along the guide rail 8d; a power/signal line 25 for supplying power and transmitting a signal to the contact image sensor unit 3c; a driving motor 26b; and gears 24c and 24d for propagating power from the driving motor 26b to the belt 30b.

The contact image sensor unit 3c is driven by the belt 30b and slides on the guide rail 8d in the sub-scanning direction. The belt 30b is driven by the driving motor 26b via the gears 24c and 24d.

FIG. 11 is a plan view of the original cover 11a in view of the original-reading side. The original cover 11a comprises therein the line light source 14a for the light transmitting original for which the magnet 12b is provided at both ends thereof; and a guide rail 8e for guiding the line light source 14a for the light transmitting sheet in the sub-scanning direction. Although no shown in FIG. 9, the original cover 11a further comprises a power line 28 for supplying power to light on the line light source 14a for the light transmitting original.

Since the contact image sensor unit 3c is arranged in the proximity of the glass surface of the original base 2c and the line light source 14a for the light transmitting original is arranged in the proximity of the glass surface of the cover glass 23 for covering the original as mentioned above, the contact image sensor unit 3c and the line light source 14a for the light transmitting sheet are interlockingly moved by the attraction of the magnet 12a provided at both the ends of the contact image sensor unit 3c in the longitudinal direction thereof and the magnet 12b provided at both the ends of the line light source 14a for the light transmitting sheet in the longitudinal direction thereof.

The light transmitting original 1b is arranged between the contact image sensor unit 3c and the line light source 14a for the light transmitting sheet, and can be read by moving the contact image sensor unit 3c and the line light source 14a for the light transmitting original relative thereto.

According to the second embodiment, since the image reading apparatus does not include a motor or the like for driving the line light source for the light transmitting original in the sub-scanning direction, the thickness of the original cover can be made thin. The interlocking movement of the line sensor and the line light source for the light transmitting original and the arrangement of the original therebetween enable the reading of the original having a length corresponding to a distance within which the line light source and the line sensor can be moved. Further, the movement of the original enables the reading of the original having a long length. Furthermore, the manufacturing of a long light-source allows the reading of the original having a width corresponding the length of the line light sensor.

The line light source 14a for the light transmitting original comprises a light guide plate and R-, G-, and B-LEDS, and may be assembled by mounting R-, G-, and B-LED chips over the light guide plate or by providing an LED array formed by arranging the R, G-, and B-LED chips at a predetermined interval and providing the light guide plate thereon.

The contact image sensor unit 3c incorporates a line light source necessary for reading the sheet original. As disclosed in Japanese Patent Unexamined Application Publication No. 10-126581, a contact image sensor unit incorporating the line light source for the sheet original is exemplified. FIG. 12 is a cross-sectional view of the contact image sensor unit disclosed in Japanese Patent Unexamined Application Publication No. 10-126581.

The contact image sensor unit comprises a frame 41, having thereon concave portions 42 and 43. A case 45 for accommodating a light source for the sheet original 44 comprising a transparent stick-shaped light guide plate and R-, G-, and B-LED modules is arranged in the concave portion 42. A substrate 48 on which a line sensor 47 is mounted is attached to the concave portion 43. A rod lens array 49 as an erect unity-magnification optical system is held in the frame 41.

The light source for the light transmitting original is lit off and the light source for the sheet original 44 is lit, thus to read the sheet original. Synchronously with the reading of the sheet original, the light source for the sheet original 44 sequentially lights on the R-, G-, and B-LEDs. Light outputted from the light source for the sheet original 44 is reflected to the sheet original and reflection light 50 is detected by the line sensor 47 via the rod lens array 49.

The light source for the sheet original 44 is lit off and the light source for the light transmitting original is lit of, thus to read the light transmitting original. Similarly to the light source for the sheet original 44, the light source for the light transmitting original sequentially lights on the R-, G-, B-LEDs synchronously with the reading. Light is outputted from the light source for the light transmitting original, and light 50 transmits the light transmitting original and the glass plate of the original base and is detected by the line sensor 47 via the rod lens array 49.

A power supply for lighting on the light source for the light transmitting original can be used by exchanging a power supply for lighting on the sheet original by a switch.

FIG. 13 is a diagram of the circuit configuration for lighting on the light source for the light transmitting original and the light source for the sheet original in the image reading apparatus for reading the light transmitting original and the sheet original according to the second embodiment.

The contact image sensor unit 3c incorporates a line light source 14b necessary for reading the sheet original.

A control unit 56 is connected to a light-on-circuit 52 and a switch 54. The light-on circuit 52 is connected to the line light source 14a for the light transmitting original and the line light source 14b for the sheet original via the switch 54.

In order to read the light transmitting original, the light-on circuit 52 is operated in response to a control signal from the control unit 56, the control signal is outputted to the switch 54, the switch 54 is switched, and the output of the light-on circuit 52 is fed to the line light source 14a for the light transmitting original.

In order to read the sheet original, the light-on circuit 52 is operated in response to the control signal from the control unit 56, the control signal is outputted to the switch 54, the switch 54 is switched, and the output of the light-on circuit 52 is fed to the line light source 14b for the sheet original.

The switching operation of the switch 54 may manually be performed. Although the light-on circuit of the line light source 14a for the light transmitting original and the line light source 14b for the sheet original may be separately provided, the light-on circuit thereof is shared as shown in FIG. 13, so that the number of parts and the manufacturing cost can be reduced.

The line light source 14a for the light transmitting original and the line light source 14b for the sheet original share the light-on circuit 52 and can be switched. Therefore, by using the single line light source for both the light transmitting original and the sheet original, the consumption-power level can be the same as that in the case of using only one of the light source for the light transmitting original and the light source for the sheet original. Since the light-on circuit 52 is shared, power supplied from one USB (Universal Serial Bus) cable enables the operation of both the line light source 14a for the light transmitting original and the line light source 14b for the sheet original. When adding the original cover 11a to the main body 5c later, advantageously, the above operation allows the use of the first-provided USB cable and light-on circuit 52 without increasing in power consumption level of the light source. Also, advantageously, the first-provided USB cable and light-on circuit 52 can be employed without replacement.

Incidentally, according to the second embodiment, since the light source for the light transmitting original is arranged in the proximity of the glass surface of the cover glass, the light source for the light transmitting original is moved in accordance with the driving of the contact image sensor unit when it is lit off to read the sheet original. However, upon reading the sheet original, the light source for the light transmitting original may be detached from the glass surface and may be separated from the contact image sensor unit, thus to prevent the light source for the light transmitting original from being moved in accordance with the driving of the contact image sensor unit.

More specifically, upon reading the light transmitting original, the light source for the light transmitting original is lifted down and is arranged in the proximity of the cover glass so that the magnet provided for the light source for the light transmitting original can attract the magnet provided for the contact image sensor unit each other via the original base and the cover glass. Thereby, the light source for the light transmitting original can be moved in accordance with the driving of the contact image sensor unit. Upon reading the sheet original, the light source for the light transmitting original may be lifted up and may be separated from the contact image sensor unit so as to prevent the light source for the light transmitting original from being moved in accordance with the driving of the contact image sensor unit.

Figure 14A:
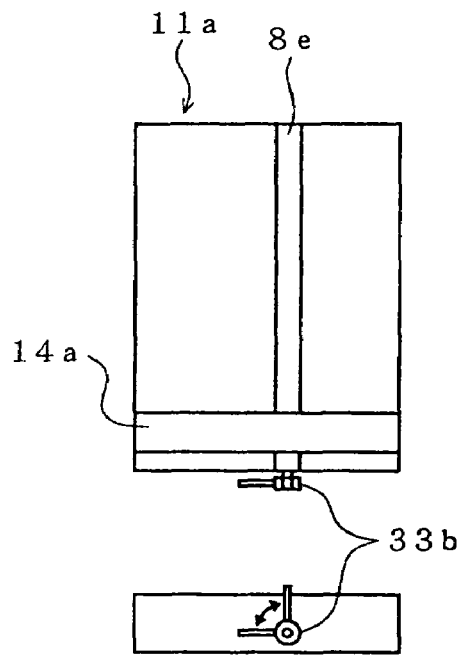
FIG. 14A is a plan view and a side view showing one example of a mechanism for lifting up or down a line light source for the light transmitting original according to the second embodiment.
Figure 14B:
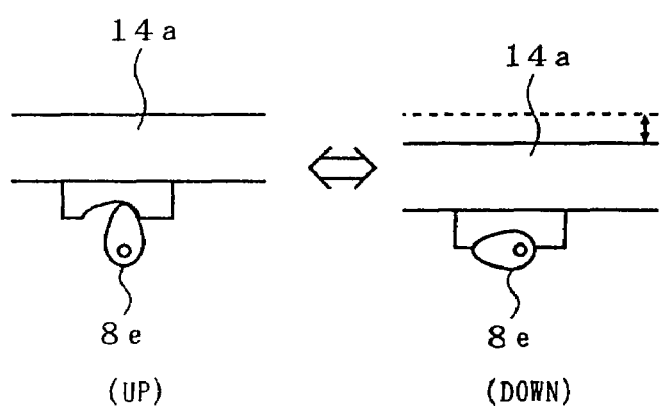
FIG. 14B is a diagram for explaining one example of the operation for lifting up or down the line light source for the light transmitting original according to the second embodiment.

FIG. 14A is a plan view and a side view showing one example of a mechanism for lifting up or down the light source for the light transmitting original according to the second embodiment, and FIG. 14B is a diagram for explaining one example of the operation for lifting up or down the light source for the light transmitting original according to the second embodiment.

Referring to FIGS. 14A and 14B, a section of a guide rail 8e is oval-shaped and is used as a cam. The line light source 14a for the light transmitting original is lifted up or down by rotating the guide rail 8e by-using a lever 33b.

Figure 15A:
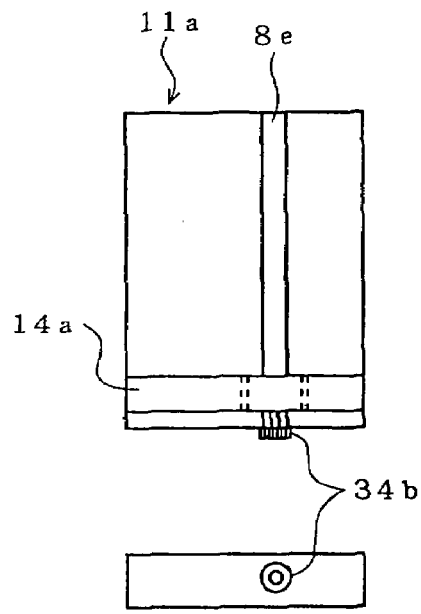
FIG. 15A is a plan view and a side view showing another example of the mechanism for lifting up or down the line light source for the light transmitting original according to the second embodiment.
Figure 15B:
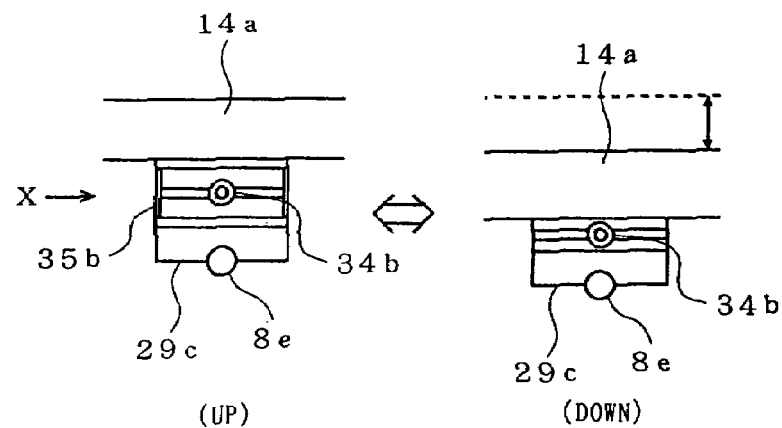
FIG. 15B is a diagram for explaining another example of the operation for lifting up or down the line light source for the light transmitting original according to the second embodiment.

FIG. 15A is a plan view and a side view showing another example of the mechanism for lifting up or down the line light source for the light transmitting original according to the second embodiment, and FIG. 15B is a diagram for explaining another example of the operation for lifting up or down the line light source for the light transmitting original.

Figure 15C:
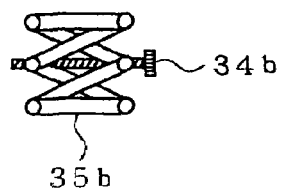
FIG. 15C is a diagram of a jack in an X-direction of FIG. 15B according to the second embodiment.

A jack 35b is inserted between a supporting plate 29c for supporting the guide rail 8e and the line light source 14a for the light transmitting original and lifting up or down the line light source 14a for the light transmitting original by the rotation of a screw which is caused by rotating a knob 34b. FIG. 15C is a diagram of the jack 35b in an X-direction of FIG. 15B.

Next, shading correction will be described.

Upon reading the image, preferably, the shading correction may be performed so as to correct the variation in sensitivity to each dot of the line sensor and the variation in illuminance of the line light source for the light transmitting original and for the line light source for the sheet original.

Since the shading correction is performed to correct the variation in sensitivity of the line sensor and the variation in illuminance of the line light source, it is performed not over the read image but one-dimensionally in the longitudinal direction of the line light source.

The line light source is used to read the light transmitting original and, therefore, the shading correction may one-dimensionally be performed, similarly to the shading correction of the line sensor in the image reading apparatus using the CCD sensor.

FIG. 16 is a diagram showing one example of the constitution of a shading correcting device used for the image reading apparatus according to the second embodiment of the present invention.

Referring to FIG. 16, the shading correcting device comprises: a control unit 90 for totally controlling the shading correcting device; a switching circuit 91 for switching the output destination of an electric signal which is outputted via an A/D converting circuit 98 from the line sensor 89 under the control operation of the control unit 90; a memory 93 for storing an appropriate output level for the line sensor as a value that the output level of the electric signal from the line sensor 89 is not saturated; a comparing circuit 92 for comparing the output level of the electric signal from the line sensor 89 with the appropriate output level for the line sensor; an LED output adjusting circuit 94 for adjusting a light output from the LED depending on the comparison result; a correction coefficient calculating unit 95 for calculating a correction coefficient for weighting; a memory 96 for storing the correction coefficient calculated by the correction coefficient calculating unit 95; and a shading correcting unit 97 for multiplying the correction coefficient read from the memory 96 to the output level of the electric signal from the line sensor 89.

Next, the operation of the shading correcting device shown in FIG. 16 will be described.

First, any of R-, G-, and B-LED chips of an LED device 99 provided for the line light source is lit on and the contact image sensor unit reads and scans an original while the original is not set on the original base or a half-transparent film having the same light transmittance as that of a negative/positive film is placed thereon. Then, the line sensor 89 receives the light from the line light source, and outputs the electric signal. The A/D converting circuit 98 converts the electric signal outputted from the line sensor 89 into a digital signal, the switching circuit 91 is switched under the control of the control unit 90, and the A/D converted electric signal from the line sensor 89 is outputted to the comparing circuit 92. The comparing circuit 92 compares the output level of the electric signal from the line sensor 89 outputted from the switching circuit 91 with the appropriate output level for the line sensor read from the memory 93. Depending on the comparison result, the LED output adjusting circuit 94 adjusts the light output from the LED device 99 by using a light-on current value, a light-on pulse width, and the like so as to prevent the saturation of the output level of the electric signal from the line sensor 89.

Next, when the light output of the LED device 99 is determined, the contact image sensor unit reads and scans the image while the original dose not exist or the half-transparent film is placed. Then, the line sensor 89 receives the light from the line light source and outputs an electric signal. The A/D converting circuit 98 converts the outputted electric signal from the line sensor 89 into a digital signal, thereafter, the switching circuit 91 is switched under the control of the control unit 90, and the A/D converted electric signal from the line sensor 89 is outputted to the correction coefficient calculating unit 95. The output level of the electric signal from the line sensor varies in one-dimensional position of the line sensor depending on the variation in sensitivity of the line sensor, and the variation in illuminance of the line light source, as mentioned above. The correction coefficient calculating unit 95 calculates weighting using electrical operation so that the varied output level of the electric signal becomes constant. The memory 96 stores the weighting information for the one-dimensional position of each pixel of the line sensor and for the light emission of the R-, G-, and B-LED chips, as a correction coefficient, and uses the stored correction coefficient when actually reading the image.

In a weighting method, the memory 96 stores therein as the correction coefficient a reciprocal of the output level of the electric signal for each pixel or a value obtained by multiplying the reciprocal of the output level of the electric signal for each pixel by a constant (average of the output level of the electric signal for each pixel, etc.).

The above half-transparent film uses a base film which is a base material of a read film. Upon reading the image, the base film has a transmittance higher than that of a film to be actually read. Therefore, the output level of the electric signal in the case of the film to be read does not exceed the saturated value by adjusting the light output from the LED device 99 by use of the base film so as to prevent the saturation of the output level of the electric signal from the line sensor 89.

That is, the dynamic range can be wide when reading the original with all R, G, and B, because of the film having the same color as that of the base of the film to be read, namely, the base film is used upon adjusting the light output from the LED device and correcting the shading.

Next, upon actually reading the image, the switching circuit 91 is switched under the control of the control unit 90, and the electric signal from the line sensor 89 is outputted to the shading correcting unit 97. The shading correcting unit 97 reads the correction coefficient from the memory 96 and multiplies the correction coefficient corresponding to each pixel to the output level of the electric signal of each pixel, which is outputted from the line sensor 89, thus reducing the variation in sensitivity of the line sensor and the variation in illuminance of the line light source.

As mentioned above, in the image reading apparatus of the present invention, since the area light source is not used for the light source for the light transmitting original, the shading correction in the two-dimensional direction is not necessary. Since the line light source and the line sensor are used for reading the light transmitting original, the shading correction may be performed in the one-dimensional direction.

Although the second embodiment has been described by using the contact image sensor unit having the line sensor, not contact image sensor unit but only the line sensor may be provided for the main body of the image reading apparatus capable of reading only the light transmitting original.

Further, although the second embodiment has been described by using the attraction of the magnets so as to move the light source for the light transmitting original in the sub-scanning direction, the light source for the light transmitting original may be moved in the sub-scanning direction by using the belt for driving similarly to the contact image sensor unit. Furthermore, the light source for the light transmitting original may be moved in the sub-scanning direction by switching on and off a driving source which is provided with the light source itself for the light transmitting original. In these cases, the light source for the light transmitting original needs to be moved simultaneously with the contact image sensor unit.

Next, a third embodiment of the present invention will be described with reference to the drawings.

FIGS. 17A to 17F are diagrams showing an image reading apparatus of a contact image sensor unit type for reading the image of the light transmitting original and the sheet original, according to the third embodiment of the present invention.

Figure 17D:
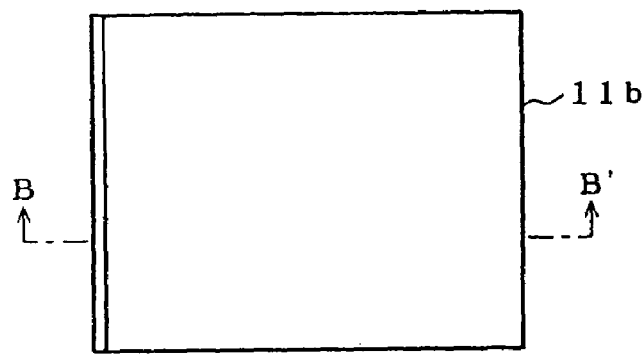
FIG. 17D is a plan view of the image reading apparatus when the original cover is closed according to the third embodiment.
Figure 17E:
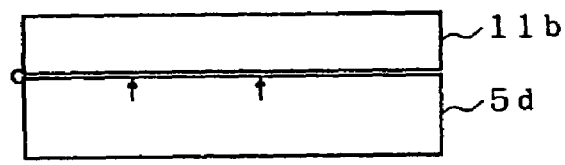
FIG. 17E is a side view of the image reading apparatus when the original cover is closed according to the third embodiment.
Figure 17F:
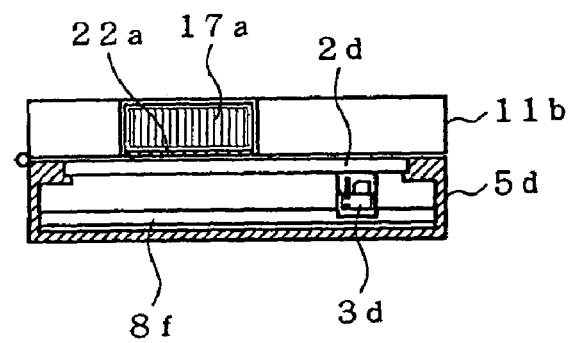
FIG. 17F is a cross-sectional view of the image reading apparatus along a B–B' line of FIG. 17D according to the third embodiment.

FIG. 17A is a plan view of the image reading apparatus for reading images of the light transmitting original and the sheet original when an original cover is opened, FIG. 17B is a side view of the image reading apparatus when the original cover is opened, FIG. 17C is a cross-sectional view of the image reading apparatus along an A–A' line of FIG. 17A, FIG. 17D is a plan view of the image reading apparatus when the original cover is closed, FIG. 17E is a side view of the image reading apparatus when the original cover is closed, and FIG. 17F is a cross-sectional view of the image reading apparatus along a B–B' line of FIG. 17D.

Referring to FIGS. 17A to 17F, the image reading apparatus comprises a main body 5d thereof, and an original cover 11b for covering the original and shielding ambient light, which is openably and closely supported to the main body 5d.

The top of the main body 5d comprises an original base 2d on which the original to be read is placed. The original base 2d is made of a transparent plate such as a glass plate, and is made of the glass plate according to the third embodiment. Relatively-smooth, fine, and uneven portions are formed on the glass surface of the original base 2d so as to prevent the adhesion of the light transmitting original thereon and the occurrence of Newton rings upon placing the light transmitting original.

Upon setting the light transmitting original onto the glass surface of the original base, the light transmitting original is extremely in the proximity of the glass surface of the original base (at a distance of ¼ or less of the wavelength) and is adhered thereto and, thus, the Newton rings are caused. Therefore, to prevent the Newton rings, the fine uneven portions are formed onto the glass surface of the original base so that the distance between the light transmitting original and the glass surface of the original base is ¼ or more of the wavelength by using the fine uneven portions.

In addition, the glass plate used for the original base 2d has the specified shape of the uneven portions and coarseness thereof so as to prevent an effect on the optical characteristics upon reading the image and have a sufficiently smooth advantage.

The top of the main body 5d comprises a marker 21 for displaying the position of the transmitting original provided around the original base 2d, which is used for positioning the original when reading the light transmitting original.

The main body 5d comprises therein a contact image sensor unit 3d which is long in the main scanning direction and a guide rail 8f for guiding the contact image sensor unit 3d in the sub-scanning direction (perpendicular to the main scanning direction).

The original cover 11b comprises therein a light source unit 17a and a scattering plate 22a for scattering light on the side for covering the original of the light source unit 17a. The light source unit 17a is arranged to the original cover 11b so that four corners of the light source unit 17a are located at the marker 21 for displaying the position of the transmitting original when the original cover 11b is closed and then is overlapped to the main body 5d.

Incidentally, when the scattering plate 22a is made of the glass plate, the original is adhered to the glass surface in some cases. Therefore, similarly to the original base 2d, relatively-smooth, fine, and uneven portions may be formed at the side for covering the original of the glass plate so as to prevent the adhesion of the original onto the scattering plate 22a.

Figure 18:
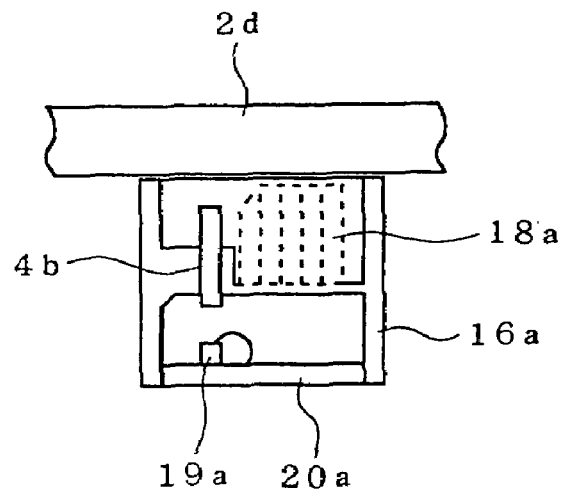
FIG. 18 is a cross-sectional view of an enlarged K-portion shown in FIG. 17C according to the third embodiment.

FIG. 18 is a cross-sectional view of an enlarged K-portion shown in FIG. 17C according to the third embodiment, in which the contact image sensor unit 3d is represented in detail. The contact image sensor unit 3d is arranged in the proximity of the glass surface of the original base 2d and comprises in a frame 16a a line light source composed of an LED module and a stick-shaped transparent light guide plate 18a. The LED modules comprises LEDs for emitting light of R, G, and B, and is provided on an end surface at both ends of the stick-shaped light guide plate 18a in the longitudinal direction thereof.

A sensor board 20a on which a line sensor 19a is mounted is attached in the frame 16a. The line sensor 19a comprises a light receiving element having the sensitivity to R, G, and B. A rod lens array 4b as an erect unity-magnification optical system is held on the optical axis of the line sensor 19a.

Figure 19:
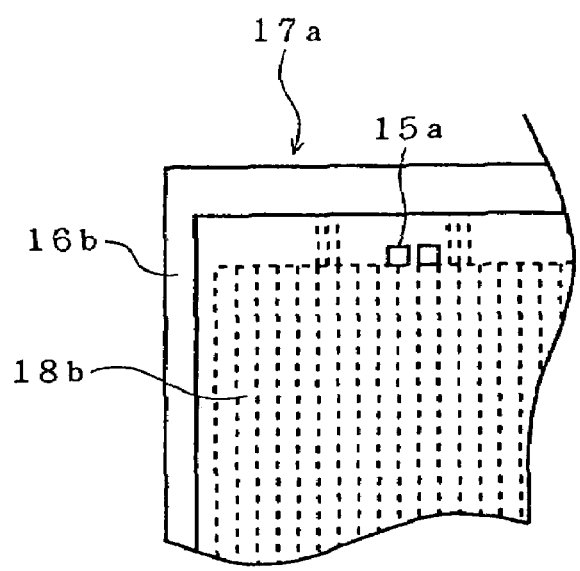
FIG. 19 is a partially plan view of an enlarged L-portion shown in FIG. 17A according to the third embodiment.

FIG. 19 is a partially plan view of an enlarged L-portion shown in FIG. 17A. The light source unit 17a comprises in a frame 16b a area light source having an LED module 15a and a transparent area light guide plate 18b. The LED module 15a comprises LEDs for emitting light of R, G, and B, and is provided at the end surface of the area light guide plate 18b.

Upon reading the image of the sheet original, the sheet original is placed onto the original base 2d and the original cover 11b is closed. Then, the area light source of the light source unit 17a is lit off, and the LEDs of R, G, and B, as the line light sources, incorporated in the contact image sensor unit 3d are sequentially lit on. Reflection light from the sheet original is received to the line sensor 19a via the rod lens array 4b and then the contact image sensor unit 3d is moved to the sheet original along the guide rail 8f in the sub-scanning direction, thus to read the image of the sheet original.

Upon reading the image of the light transmitting original, the light transmitting original is placed onto the original base 2d so that four corners of the original are located at the marker 21 for displaying the position of the transmitting original. The line light source incorporated in the contact image sensor unit 3d is lit off, the original cover 11b is closed, and the LEDs of R, G, and B incorporated in the light source unit 17a are sequentially lit on. The transmission light from the light transmitting original is received to the line sensor 19a via the rod lens array 4b and then the contact image sensor unit 3d is moved to the light transmitting original along the guide rail 8f in the sub-scanning direction, thus to read the image of the light transmitting original.

As described above, relatively-smooth, fine, and uneven portions are formed onto the glass surface of the original base 2d. The uneven portions are formed by etching soda-lime glass with solution mainly consisting of hydrofluoric acid.

By forming the smooth, fine, and even portion on the surface of the original base 2d, the amount of scattered rays can be reduced and the deterioration of characteristics for reading the image can be suppressed. Further, since the adhesion of the light transmitting original resulting in the Newton rings is prevented, the light transmitting original can directly be placed on the glass surface and the external intensity of the glass plate can be increased.

For example, the adhesion of the original (resulting in the Newton rings) can be prevented and the sufficient optical characteristics can be obtained with a glass plate having an uneven surface of the average coarseness of the center line Ra of 0.1 µm and a root means square coarseness RMS of 0.1 µm.

The surface coarseness for preventing the adhesion and satisfying the optical characteristics ranges as follows.

$$0.02 \ \mu m \leq Ra \leq 1.0 \ \mu m$$

Preferably $$0.05 \ \mu m \leq Ra \leq 0.5 \ \mu m.$$

When Ra<0.05 µm, the effect for preventing the adhesion is decreased. When Ra<0.02 µm, the effect for preventing the adhesion is further decreased. When Ra>0.5 µm, the rays are scattered. When Ra>1.0 µm, the rays are further scattered.

According to the third embodiment, the adhesion of the light transmitting original can be prevented because the predetermined uneven portion is formed onto the glass surface of the original base. Since the light transmitting original is not continuously adhered and a contact area is reduced, the light transmitting original can directly be placed onto the glass surface of the original base. In addition, a jig or the like dedicated for the light transmitting original is not required, the operability is improved, and the structure of the image reading apparatus becomes simple. Extremely advantageously, this results in improving the deterioration in resolution due to the rise of the original caused by the short focusing depth, without a mechanism for mechanically positioning.

In the case of reading the sheet original such as a copy original, the adhesion of toner to the copy original can be prevented and further they fingerprint is not easily put.

According to the third embodiment, the advantages can be obtained stably and continuously. More specifically, the uneven portion is directly formed onto the glass plate and, therefore, the detachment thereof can be prevented. Further, the uneven portion is relatively smooth and, therefore, it is durable against the friction and the stress upon using the glass plate.

In addition, according to the third embodiment, since the prevention of the adhesion and the light scattering is considered and the uneven surface area effective thereto is selected, the adhesion can be prevented and the scattering of light can be suppressed.

In addition, according to the third embodiment, since the abrasion resistance of the glass plate is preferable, the special maintenance is not required. Moreover, since the glass plate having a wide area is processed by wet etching, many glass plates can be cut out and costs of expensive equipment for laser processing, deposition, spattering, etc. and of the maintenance thereof can be reduced. The number of processing glass plates per unit time can be increased.

Next, modifications of the third embodiment will be described. In an image reading apparatus according to the modifications of the third embodiment, in place of the aforementioned original base, a glass plate on which fine projections having a periodic array thereon are formed is used for the original base. Other features of the modifications are similar to those of the above-described image reading apparatus according to the third embodiment. Further, according to the modifications, the range of the coarseness of the glass surface to prevent the adhesion and satisfy the optical characteristics can be specified similarly to the third embodiment. Preferably, the projections formed onto the glass have circular edges so as to reduce the friction to the original, and are suitable to be hemisphere-shaped. The adhesion (Newton ring) can be prevented by using the glass plate as the original base.

As methods for forming the fine projections having the periodic array, for example, there are a method for irradiating laser beams via a shielding plate having a predetermined hole and forming a projection and a method for forming a predetermined mask pattern on a glass plate, etching or ion exchanging the glass plate, and thereafter removing the mask pattern.

According to the modification, the fine projections can be formed by using a pattern with high accuracy such as a photomask and it is therefore possible to provide a glass plate having a periodic array of the fine projections, in which the effect on preventing the adhesion is stable on the glass surface.

Although the third embodiment has described that the adhesion of the film original, such as the light transmitting original, to the glass surface of the original base is prevented, in addition to the film original, it is possible to prevent the adhesion of the original having an emulsifier surface, such as a photograph, to the glass surface of the original base.

Next, a fourth embodiment of the present invention will be described with reference to the drawings.

According to the fourth embodiment, an image reading apparatus comprises a light-emitting element and a light receiving element of visible light and light other than the visible light, which read information capable of being read by the visible light and the light other than the visible light, for example, secret information or a discrimination mark which is not visible with the naked eye (sheet original, the light transmitting original, the watermarked original, etc.). According to the fourth embodiment, infrared light as the light other than the visible light is used.

FIGS. 20A to 20E are diagrams showing the image reading apparatus for reading the sheet original according to the fourth embodiment of the present invention.

Figure 20D:
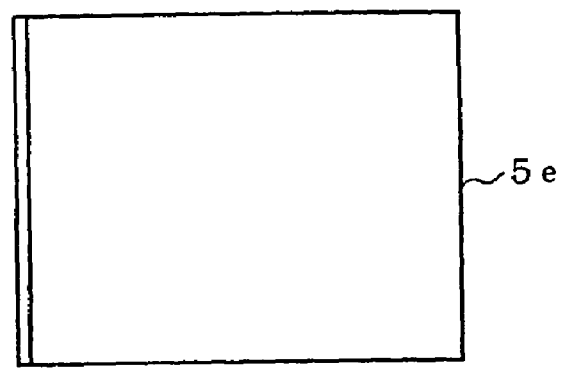
FIG. 20D is a plan view of the image reading apparatus when the original cover is closed according to the fourth embodiment.
Figure 20E:
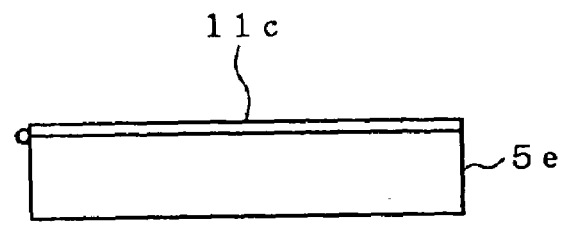
FIG. 20E is a side view of the image reading apparatus when the original cover is closed according to the fourth embodiment.

FIG. 20A is a plan view of the image reading apparatus for reading the sheet original when an original cover is opened, FIG. 20B is a side view of the image reading apparatus when the original cover is opened, FIG. 20C is a cross-sectional view of the image reading apparatus along an A–A' line of FIG. 20A, FIG. 20D is a plan view of the image reading apparatus when the original cover is closed, and FIG. 20E is a side view of the image reading apparatus when the original cover is closed.

Referring to FIGS. 20A to 20E, the image reading apparatus comprises a main body 5e thereof and an original cover 11*c* for covering the original and shielding ambient light which can openably and closably be supported to the main body 5*e*.

The main body 5*e* comprises therein a contact image sensor unit 3*e* which is longitudinal in the main scanning direction, and a guide rail 8*g* for guiding the contact image sensor unit 3*e* in the sub-scanning direction (perpendicular to the main scanning direction). The top of the main body 5*e* comprises an original base 2*e* onto which the sheet original is placed.

FIG. 21 is a partially plan view of an enlarged J-portion shown in FIG. 20A, in which an end portion of the contact image sensor unit 3*e* in the main scanning direction is represented. FIG. 22 is a cross-sectional view of an enlarged K-portion shown in FIG. 20*c*, in which the contact image sensor unit 3*e* is represented in detail. The contact image sensor unit 3*e* provided in the proximity of the original base 2*e*, comprises in a frame 16*c* a line light source having a transparent stick-shaped light guide plate 18*c* and an LED module 15*b*. The LED module 15*b* comprises LEDs for emitting R-, G-, and B-light and an LED for emitting infrared light, and is provided at an end surface of the stick-shaped light guide plate 18*c*. Incidentally, the LED for emitting the infrared light uses GaAs, AlGaAs, InGaAs, InP, and the like.

A sensor board 20*b* on which a line sensor 19*b* is mounted is attached in the frame 16*c*. The line sensor 19*b* comprises a light receiving element having the sensitivity to R-, G-, and B-light and the sensitivity to the infrared light. A rod lens array 4*c* as an erect unity-magnification optical system is held on the optical axis of the line sensor 19*b*.

The line sensor 19*b* may comprise a light receiving element having the sensitivity to all wavelength bands of the light-emitting element, namely, to the visible R-, G-, and B-light and the infrared light. Alternatively, the line sensor 19*b* may comprise a light receiving element having the sensitivity to the visible R-, G-, and B-light and a light receiving element having the sensitivity to the infrared light. Incidentally, the infrared light receiving element uses GaAs, AlGaAs, InGaAs, InP, and the like.

Upon reading the image of the sheet original, the LEDs of R-, G-, and B-light in the contact image sensor unit 3*e* are sequentially lit on. Reflection light from the sheet original is received to the line sensor 19*b* via the rod lens array 4*c* and then the contact image sensor unit 3*e* is moved to the sheet original along the guide rail 8*g* in the sub-scanning direction, thus to read the image of the sheet original.

Upon reading the image of the sheet original having the information capable of being read by only the infrared light, the LED for emitting the infrared light is lit on. The line sensor having the sensitivity to the infrared light reads the image.

Upon reading the image of the sheet original having mixed wavelength bands capable of being read by only the visible light and the infrared light, the R-, G-, and B-LEDs and the infrared-light LED are sequentially lit on and the line sensor having the sensitivity to the visible light and the infrared light reads the image.

According to the fourth embodiment, the contact image sensor unit as a light source comprises in advance the LED module for emitting the visible light and the light other than the visible light (e.g., the infrared light) which are necessary for reading the image. Therefore, it is possible to read the sheet original having the information capable of being read by only the light other than the visible light (such as the secret information or the discrimination mark which is not visible with the naked eye). The sheet original having the information capable of being read by only the light other than the visible light can be read without preparing the light source having the light other than the visible light each time the sheet original is read.

The LED chip is used as a light-emitting element having the wavelength other than the visible light. Thus, the LED chip can be used as the light source, similarly to the R-, G-, and B-LED chips in the contact image sensor unit and, therefore, another light source is not required. In the case of reading the image, the method for sequentially lighting on the light source or the method for selectively lighting on the light source can be used.

FIGS. 23A to 23F are diagrams showing the image reading apparatus for reading the image of sheet original, the light transmitting original, and the watermarked original.

Figure 23D:
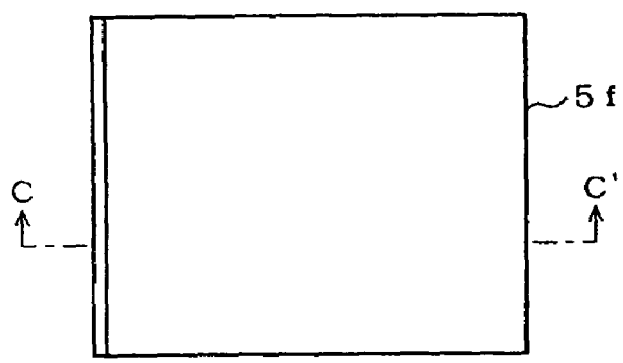
FIG. 23D is a plan view of the image reading apparatus when the original cover is closed according to the fourth embodiment.
Figure 23E:
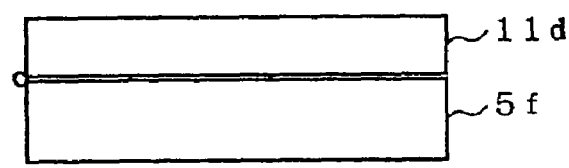
FIG. 23E is a side view of the image reading apparatus when the original cover is closed according to the fourth embodiment.
Figure 23F:
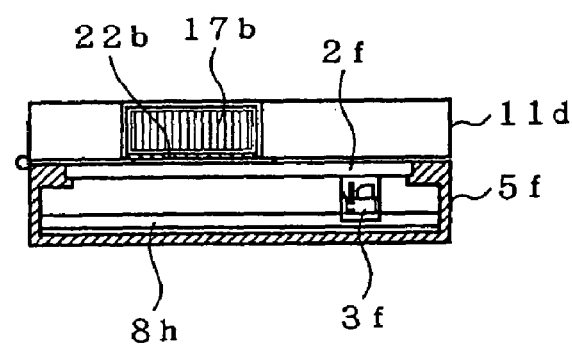
FIG. 23F is a cross-sectional view of the image reading apparatus along a C–C' line of FIG. 23D according to the fourth embodiment.

FIG. 23A is a plan view of the image reading apparatus when the original cover is opened, FIG. 23B is a side view of the image reading apparatus when the original cover is opened, FIG. 23C is a cross-sectional view of the image reading apparatus along a B–B' line of FIG. 23A, FIG. 23D is a plan view of the image reading apparatus when the original cover is closed, FIG. 23E is a side view of the image reading apparatus when the original cover is closed, and FIG. 23F is a cross-sectional view of the image reading apparatus along a C–C' line of FIG. 23D.

Referring to FIGS. 23A to 23F, the image reading apparatus comprises a main body 5*f* and an original cover 11*d* for covering the original and shielding ambient light which can openably and closably be supported to the main body 5*f*.

The main body 5*f* comprises therein a contact image sensor unit 3*f* which is longitudinal in the main scanning direction, and a guide rail 8*h* for guiding the contact image sensor unit 3*f* in the sub-scanning direction.

The contact image sensor unit 3*f* has the same structure as that of the contact image sensor unit 3*e* shown in FIGS. 20A to 20E according to the fourth embodiment. The contact image sensor unit 3*f* comprises: a line light source comprising a stick-shaped light guide plate and an LED module having LEDs for emitting R-, G-, B-light and an LED for emitting infrared light; a rod lens array; and a line sensor having the sensitivity to the R-, G-, and B-light and the infrared light.

The top of the main body 5*f* comprises an original base 2*f* onto which the sheet original is placed. An original holder 36 for positioning the original when reading the light transmitting original and the watermarked original is placed on the original base 2*f*. The original holder 36 can be detached and is detached upon reading the sheet original.

An original cover lid comprises therein a light source unit 17*b* and a scattering plate 22*b* for scattering light on the surface side for covering the original of the light source unit 17*b*. The light source unit 17*b* is arranged at the position on the original holder 36 when the original cover 11*d* is closed and is overlapped to the main body 5*f*.

Figure 24:
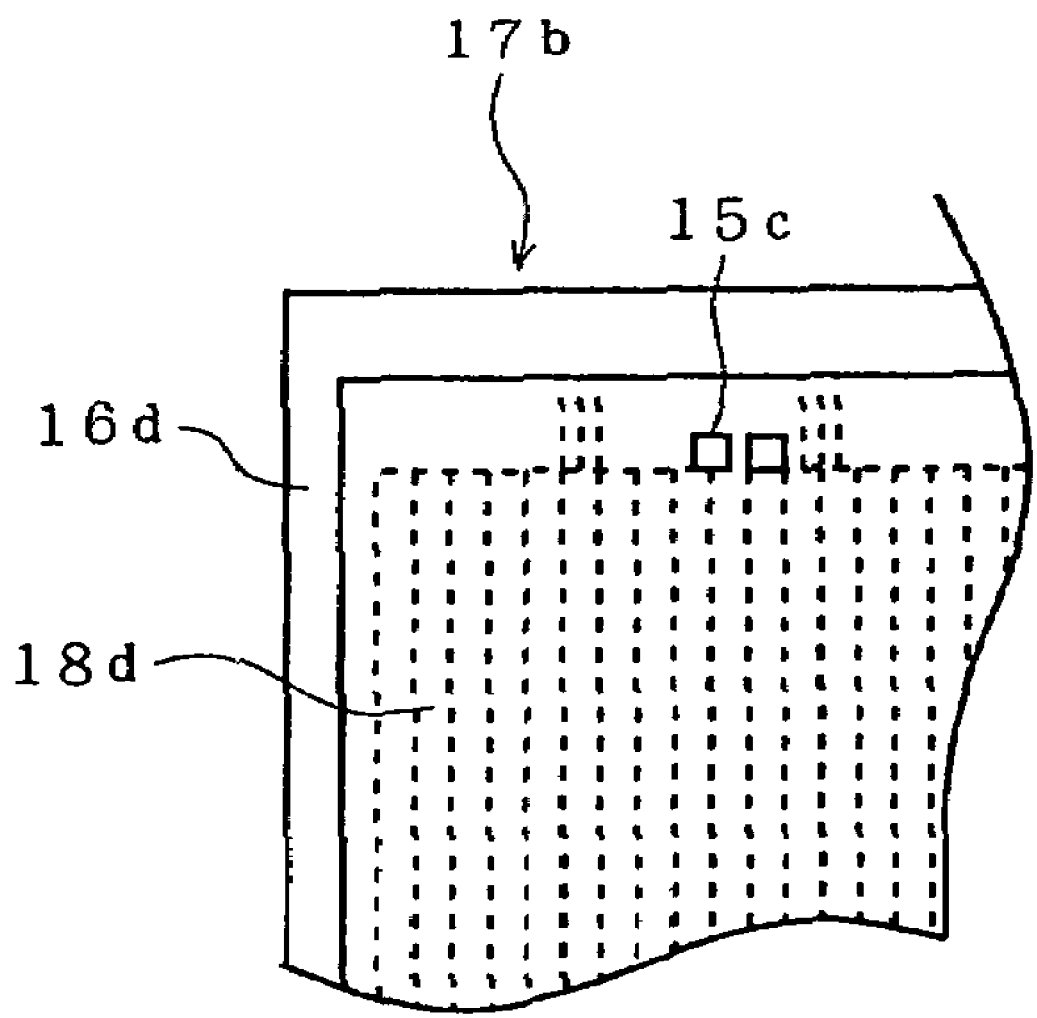
FIG. 24 is a partially plan view of an enlarged L-portion shown in FIG. 23A according to the fourth embodiment.

FIG. 24 is a partially plan view of an enlarged L-portion shown in FIG. 23A. The light source unit 17*b* comprises in a frame 16*d* a area light source comprising an LED module 15*c* and a transparent area light guide plate 18*d*. The LED module 15*c* comprises LEDs for emitting R-, G-, and B-light and an LED for emitting infrared light, and is provided at an end surface of the area light guide plate 18*d*.

Upon reading the sheet original, the area light source of the light source unit 17*b* is lit off and the line light source incorporated in the contact image sensor unit 3*f* is lit on, thus to reading the image. The sheet original capable of being read by only the infrared light or the sheet original having mixed wavelength bands of the visible light and the infrared light are read similarly to the case shown in FIGS. 20A to 20E according to the fourth embodiment.

Upon reading the light transmitting original, the light transmitting original is mounted on the original holder 36, the line light source incorporated in the contact image sensor unit 3f is lit off, and the R-, G-, B-LEDs of the light source unit 17b are sequentially lit on in accordance with the scanning of the line sensor in the contact image sensor unit 3f, thus to read the original.

Upon reading the light transmitting original capable of being read by only the infrared light, the image is read by using the LED for emitting the infrared light and the line sensor having the sensitivity to the infrared light.

Upon reading the light transmitting original having the mixed wavelength bands which is capable of being read by only the visible light and the infrared light, the R-, G-, and B-LEDs and the LED for the infrared light are sequentially lit on and the original is read by using the line sensor having the sensitivity to the visible light and the infrared light.

Upon reading the watermarked original, the watermark position is set within the range of the original holder and the R-, G-, and B-LEDS of the contact image sensor unit 3f are sequentially lit on. Reflection light from the watermarked original is received to the line sensor and the image is read. Next, the R-, G-, and B-LEDs of the light source unit 17b are sequentially lit on and the transmission light from the watermarked original is received to the line sensor and the image is read. The read images are composed.

Alternatively, the R-, G-, and B-LEDs of the contact image sensor unit 3f and the R-, G-, and B-LEDs of the light source unit 17b are sequentially lit on. In accordance therewith, the contact image sensor unit scans the image and the scanned images are composed, thereby enabling the reading of the image.

Upon reading the watermarked original having the information capable of being read by only the infrared light, the R-, G-, and B-LEDs and the infrared-light LED in the contact image sensor unit 3f and the R-, G-, and B-LEDs and the infrared-light LED in the light source unit 17b are sequentially lit on, in accordance therewith, the contact image sensor unit 3f scans the image, and the scanned images are composed, thus to read the image.

According to the fourth embodiment, although the light source unit 17b covers only a part of the moving range of the contact image sensor unit 3f, it may cover the overall moving range thereof or may cover a limited portion of the moving range depending on the application.

Further, according to the fourth embodiment, the line light source incorporated in the contact image sensor unit and the area light source incorporated in the light source unit include the LED for emitting light of the light-emitting wavelength other than the visible light. Therefore, an invisible printing matter and an authentication code, to which specific printing is performed, can be discriminated and be read without providing another light source of the light other than the visible light.

Upon scanning and reading the original, it is possible to select any of the operation for sequentially lighting on the LEDs and reading the original and the operation for lighting on only the LED for the specific wavelength and reading the original.

In the case of reading the original by using the line sensor, it is possible to obtain the homogeneity within the shading correcting range with the principle similar to that of the contact image sensor unit using the current R-, G-, and B-LEDs. Therefore, additional design becomes unnecessary.

For example, in the case of the sheet original capable of being read by only the visible light, the sheet original can be read by sequentially lighting on the R-, G-, and B-LEDs when reading the original by using the R-, G-, and B-light from the line sensor. Further, the sheet original having the information capable of being read by only the light other than the visible light can be read by sequentially lighting on the LED for emitting the light other than the visible light and the LEDs for emitting the R-, G-, and B light. Alternatively, if information other than the visible light is needed, the sheet original can be read by lighting on only the LED for emitting the light other than the visible light.

FIGS. 25A to 25F are diagrams showing an image reading apparatus for reading the image of the sheet original, the light transmitting original, and the watermarked original according to a modification of the fourth embodiment of the present invention.

Figure 25D:
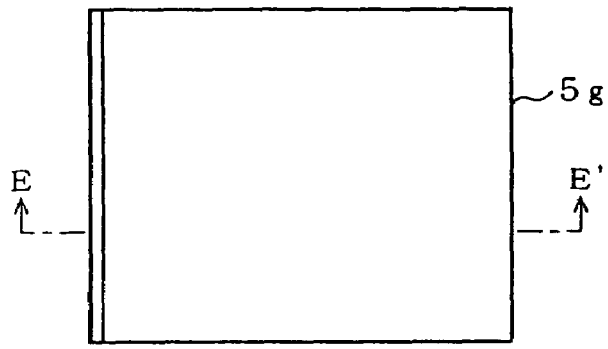
FIG. 25D is a plan view of the image reading apparatus when the original cover is closed according to the modification of the fourth embodiment.
Figure 25E:
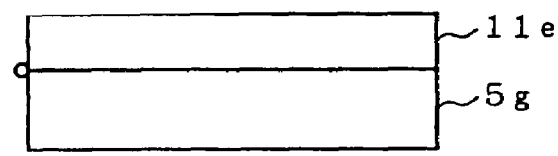
FIG. 25E is a side view of the image reading apparatus when the original cover is closed according to the modification of the fourth embodiment.
Figure 25F:
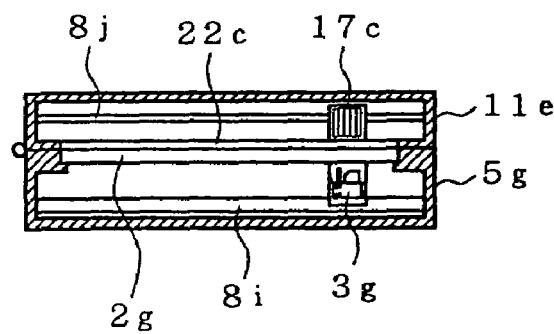
FIG. 25F is a cross-sectional view of the image reading apparatus along an E–E' line of FIG. 25D according to the modification of the fourth embodiment.

FIG. 25A is a plan view of the image reading apparatus for reading the images of the sheet original, the light transmitting original, and the watermarked original when the original cover is opened, FIG. 25B is a side view of the image reading apparatus when the original cover is opened, FIG. 25C is a cross-sectional view of the image reading apparatus along a D–D' line of FIG. 25A, FIG. 25D is a plan view of the image reading apparatus when the original cover is closed, FIG. 25E is a side view of the image reading apparatus when the original cover is closed, and FIG. 25F is a cross-sectional view of the image reading apparatus along an E–E' line of FIG. 25D.

Referring to FIGS. 25A to 25F, the image reading apparatus comprises a main body 5g thereof and an original cover 11e for covering the original and shielding ambient light, which can openably and closably be supported to the main body 5g.

The main body 5g comprises a contact image sensor unit 3g which is longitudinal in the main scanning direction, and a guide rail 8i for guiding the contact image sensor unit 3g in the sub-scanning direction (perpendicular to the main scanning direction).

The contact image sensor unit 3g has the same structure as that of the contact image sensor unit 3e shown in FIGS. 20A to 20E according to the fourth embodiment. The contact image sensor unit 3g comprises: a line light source comprising a stick-shaped light guide plate and an LED module having LEDs for emitting R-, G-, B-light and an LED for emitting infrared light; a rod lens array; and a line sensor having the sensitivity to the R-, G-, and B-light and the infrared light.

The top of the main body 5g comprises an original base 2g onto which the original is placed.

The original cover 11e comprises therein a light source unit 17c having a line light source and a guide rail 8j for guiding the light source unit 17c in the sub-scanning direction. A scattering plate 22c for scattering light is provided on the bottom surface side of the light source unit 17c.

Figure 26:
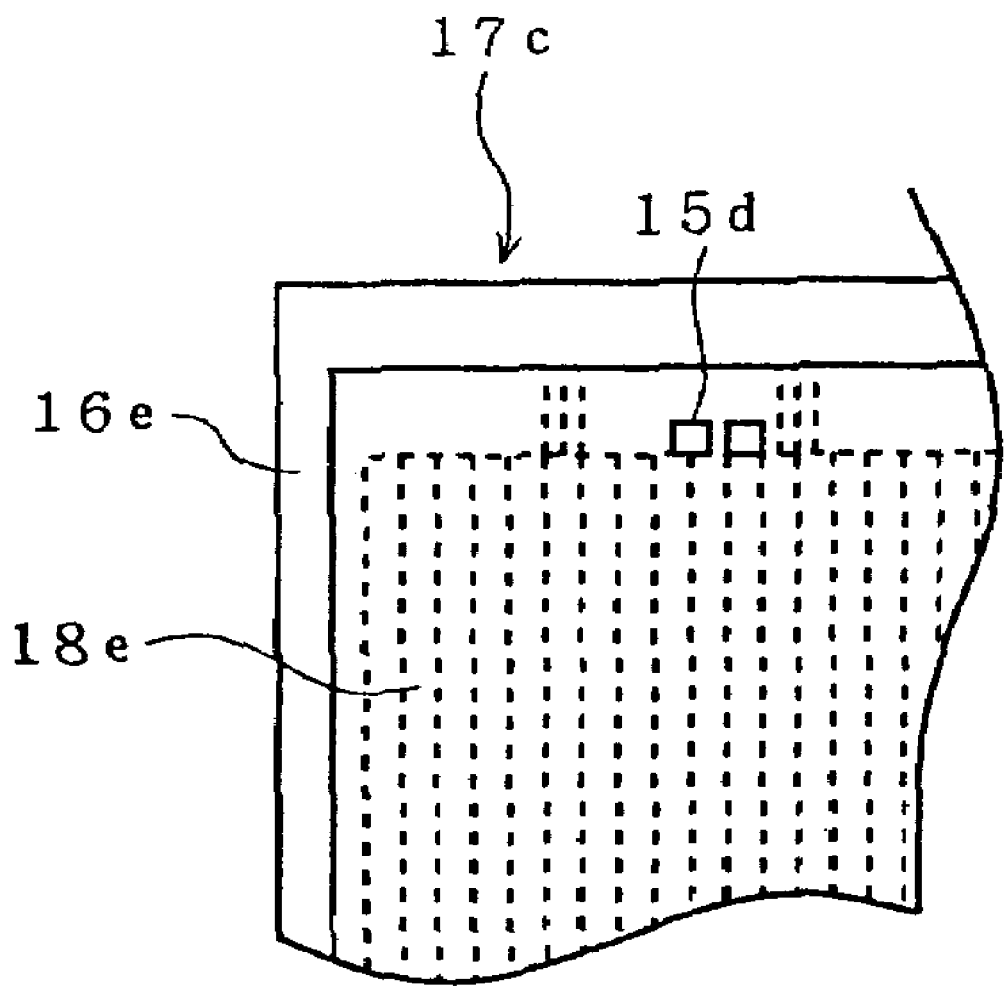
FIG. 26 is a partially plan view of an enlarged M-portion shown in FIG. 25A according to the fourth embodiment.

FIG. 26 is a partially plan view of an enlarged M-portion shown in FIG. 25A according to the fourth embodiment. The light source unit 17c comprises in a frame 16e a line light source comprising a transparent stick-shaped light guide plate 18e and an LED module 15d. The LED module 15d comprises LEDs for emitting R-, G-, and B-light and an LED for emitting infrared light, and is provided at an end surface of the stick-shaped light guide plate 18e.

The light source unit 17c is moved in the sub-scanning direction together with the contact image sensor unit 3g so that light from the light source unit 17c is incident on the rod lens array of the contact image sensor unit 3g. With the structure, the light transmitting through the light transmitting original or the watermarked original can be incident on the rod lens array of the contact image sensor unit 3g and the image can be read by the line sensor.

The light source unit 17c may be moved interlockingly with the contact image sensor unit 3g by the attraction between magnets provided for both the light source unit 17c and the contact image sensor unit 3g. Alternatively, the light source unit 17c may be moved interlockingly with the contact image sensor unit 3g in the sub-scanning direction by using a belt for driving.

Upon reading the sheet original, the line light source in the light source unit 17c is lit off, and the line light source incorporated in the contact image sensor unit 3g is lit on, thus to read the image. The sheet original capable of being read by only the light other than the visible light (e.g., infrared light) or the original sheet having the mixed wavelength bands of the visible light and the light except therefor (e.g., infrared light) are read similarly to the case in FIGS. 20A to 20E according to the fourth embodiment.

Upon reading the light transmitting original, the line light source incorporated in the contact image sensor unit 3g is lit off, the R-, G-, B-LEDs in the light source unit 17c are sequentially lit on, and the light source unit 17c is moved in accordance with the reading of the contact image sensor unit 3g. The light transmitting original capable of being read by only the light other than the visible light is read by selecting the LED for emitting the corresponding light, similarly to the case shown in FIGS. 23A to 23F according to the fourth embodiment. The light transmitting sheet having the mixed wavelength bands is read by sequentially lighting on the LEDs for emitting the R-, G-, and B-light and the LED for emitting the corresponding light simultaneously with the scanning.

Similarly to the case shown in FIGS. 23A to 23F according to the fourth embodiment, the watermarked original is read by sequentially lighting on the R-, G-, and B-LEDs in the contact image sensor unit 3g and the R-, G-, and B-LEDs in the light source unit 17c. The watermarked original capable of being read by only the light other than the visible light is read by selecting the LED chip for emitting the light other than the visible light. The watermarked original having the mixed wavelength bands is read by sequentially lighting the R-, G-, and B-LEDs and the infrared-light LED in the contact image sensor unit 3g and the R-, G-, and B-LEDs and the infrared-light LED in the light source unit 17c.

According to the fourth embodiment, the light source unit is moved interlockingly with the movement of the contact image sensor unit. Therefore, the original can be read within up to the length within which the contact image sensor unit can be moved and, thus, the light transmitting original with a wide area or the watermarked original with a wide area can be read.

Further, according to the fourth embodiment, the line light source incorporated in the light source unit is used. Therefore, the shading correction for the inhomogeneity of the light amount of the line light source and for the inhomogeneity of the sensitivity of the line sensor may be performed only one-dimensionally in the longitudinal direction of the line light source. Therefore, the shading correction of the light source incorporated in the light source unit can easily be performed.

Figures 27A, 27B:
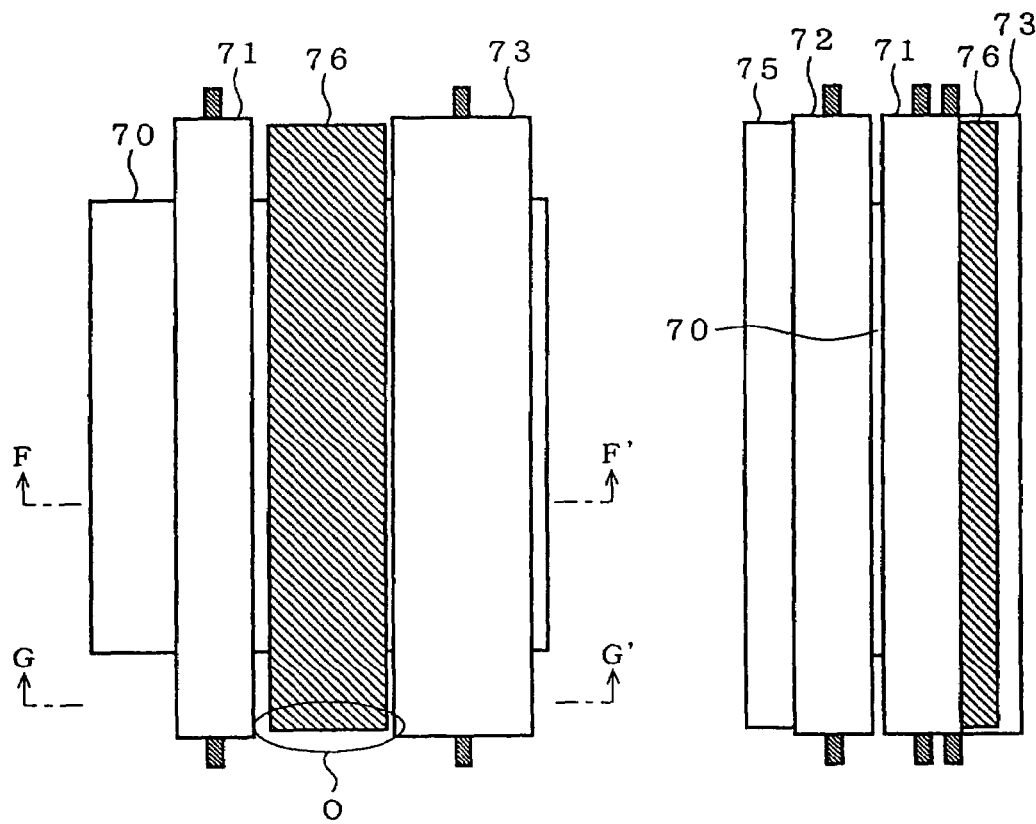
FIG. 27A is a plan view of the image reading apparatus having an original feeding mechanism according to the fourth embodiment.
FIG. 27B is a side view of the image reading apparatus according to the fourth embodiment.
Figure 27C:
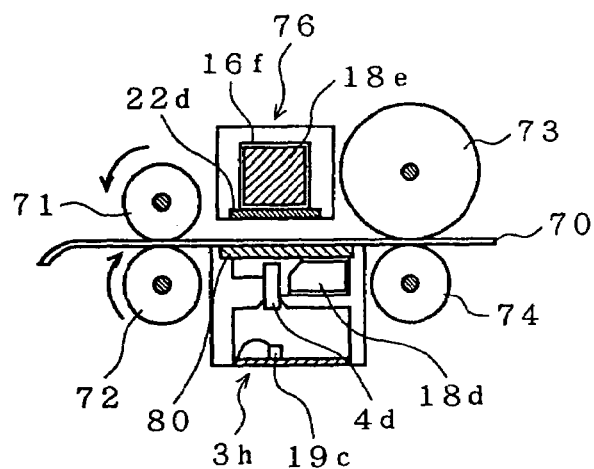
FIG. 27C is a cross-sectional view of the image reading apparatus along an F–F' line of FIG. 27A according to the fourth embodiment.

FIGS. 27A to 27C are diagrams showing an image reading apparatus having an original feeding mechanism (sheet feeder).

Figure 28:
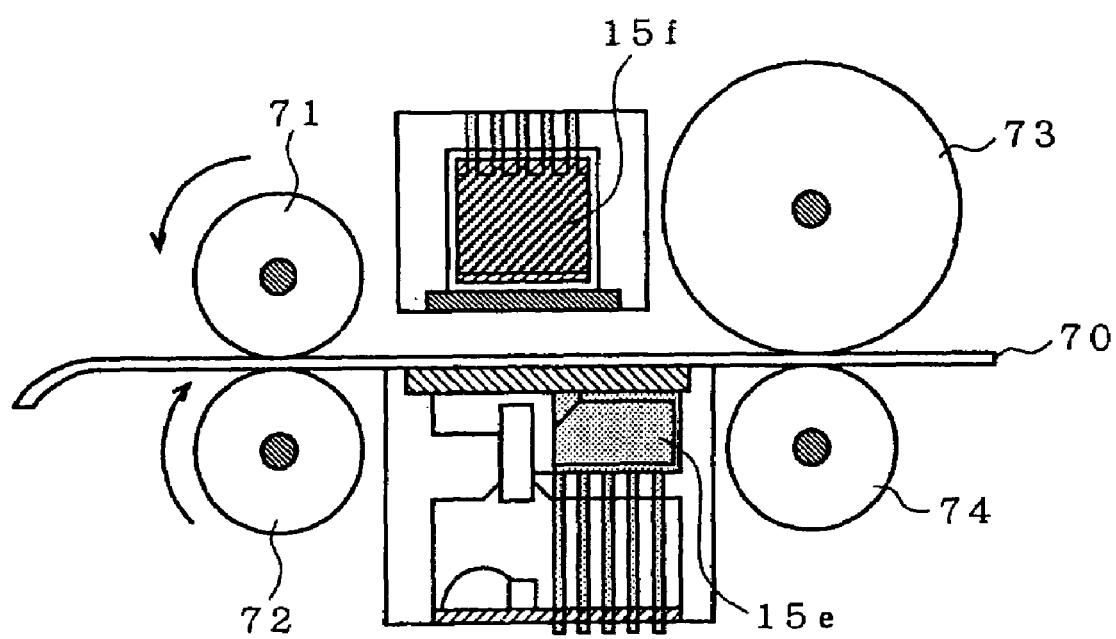
FIG. 28 is a cross-sectional view of the imager reading apparatus along a G–G' line of FIG. 27A according to the fourth embodiment.

FIG. 27A is a plan view of the image reading apparatus having the original feeding mechanism, FIG. 27B is a side view of the image reading apparatus, FIG. 27C is a cross-sectional view of the image reading apparatus along an F–F' line of FIG. 27A, and FIG. 28 is a cross-sectional view of the image reading apparatus along a G–G' line of FIG. 27A.

An original 70 is sandwiched and pressed between a platen roller 71 and a platen roller 72 which is rotated in accordance with the rotation of the platen roller 71, is further sandwiched and pressed between a platen roller 73 and a platen roller 74 which is rotated in accordance with the rotation of the platen roller 73, and is fed by the rotation of the platen rollers 71 to 74. A contact image sensor unit 3h is arranged at one side of the original 70 between the platen rollers 71 and 72 and the platen rollers 73 and 74. A top unit 76 comprising a line light source is arranged at the other side of the original 70.

The contact image sensor unit 3h comprises therein: a line light source comprising an LED module and a transparent stick-shaped light guide plate 18d; a rod lens array 4d; and a line sensor 19c having the sensitivity to the R-, G-, and B-light and the infrared light. Further, the contact image sensor unit 3h comprises a glass cover 80 at the top thereof.

Referring to FIG. 28, at the end portion in the main scanning direction, the line light source incorporated in the contact image sensor unit 3h comprises an LED module 15e comprising LEDs for emitting the R-, G-, and B-light and an LED for emitting the infrared light at an end surface of the stick-shaped light guide plate 18d.

The top unit 76 comprises in a frame 16f a line light source comprising an LED module and a transparent stick-shaped light guide plate 18e, and a scattering plate 22d for scattering light downstream of the line light source.

As shown in FIG. 28, at the end portion in the main scanning direction, the line light source incorporated in the top unit 76 comprises an LED module 15f comprising LEDs for emitting the R-, G-. and B-light and an LED for emitting the infrared light at an end surface of the stick-shaped light guide plate 18e.

Light from the LED module 15f is incident on the line sensor 19c via the rod lens array 4d in the contact image sensor unit 3h.

Similarly to the case in FIGS. 20A to 20E according to the fourth embodiment, the reading of the sheet original uses the line light source incorporated in the contact image sensor unit 3h. The LEDs for emitting the R-, G-, and B-light are sequentially switched and the sheet original is fed by the rollers to read the image.

In the case of the sheet original capable of being read by only the light other than the visible light, similarly to the case in FIGS. 20A to 20E according to the fourth embodiment, only the LED for emitting the light having the corresponding wavelength is selected and the. sheet original is read. In the case of the sheet original having the mixed wavelength bands, the LEDs for emitting the R-, G-, and B-light and the LED for emitting the light having the corresponding wavelength are sequentially switched and the sheet original is read.

Upon reading the light transmitting original, similarly to the case in FIGS. 23A to 23F according to the fourth embodiment, the line light source incorporated in the contact image sensor unit 3h is lit off, the light source is switched to the line light source of the light source unit 76, the LED chips are sequentially switched, and the light transmitting original is fed by the rollers and is read.

In the case of the light transmitting original capable of being read by only the light other than the visible light, similarly to the case in FIGS. 23A to 23F according to the fourth embodiment, only the LED chip for emitting the light of the corresponding wavelength in the line light source of the top unit 76 is selected and the light transmitting original is read. In the case of the light transmitting original having the mixed wavelength band, the R-, G-, and B-LED chips and the LED chip for emitting the light of the corresponding wavelength are sequentially switched.

In the case of the watermarked original, similarly to the case in FIGS. 23A to 23F according to the fourth embodiment, the R-, G-, and B-LEDs in the contact image sensor unit 3h and the R-, G-, and B-LEDS in the top unit 76 are sequentially switched. Then, the watermarked original is read in accordance with the timing of the sheet feed. Further, in the case of the watermarked original capable of being read by only the light other than the visible light, the LED chip for emitting the light other than the visible light is selected and the original is read in accordance with the sheet feed. Furthermore, in the case of the watermarked original having the mixed wavelength band, the R-, G-, and B-LEDs and the infrared-light LED in the contact image sensor unit 3h and the R-, G-, and B-LEDs and the infrared-light LED in the top unit 76 are sequentially switched. Then, the watermarked original is read in accordance with the timing of the sheet feed.

In the fourth embodiment, the original capable of being read by the infrared light has been illustrated. In addition, upon reading the original by irradiating the visible light and detecting the infrared light outputted, a line sensor for the infrared light may be provided. In addition, upon reading the original by irradiating the infrared light and detecting the visible light outputted, an LED chip for emitting the infrared light may be provided. In addition, upon reading the original by irradiating the visible light and detecting ultraviolet light outputted, a line sensor for the ultraviolet light may be provided. In addition, upon reading an original by irradiating the ultraviolet light and detecting the visible light outputted, a light source for the ultraviolet light may be provided.

What is claimed:

1. An image reading apparatus of a contact image sensor type for reading a light transmitting original by moving a contact image sensor unit on a guide rail, the image reading apparatus including a separate adjusting mechanism,
   wherein a distance from an original surface of the light transmitting original to the contact image sensor unit is adjusted by using the adjusting mechanism to adjust a position of a surface of the guide rail on which the contact image sensor unit moves and, thus, a resolution is held.

2. An image reading apparatus according to claim 1, wherein the distance from the original surface of the light transmitting original to the contact image sensor unit is adjusted by forming said guide rail to be rotated and cam-shaped.

3. An image reading apparatus of a contact image sensor for reading a light transmitting original and a reflecting sheet original, the light transmitting original and the reflecting sheet original being alternatively positioned by moving a contact image sensor unit on a guide rail, including a lifting mechanism, positioned between the guide rail and the contact image sensor unit, the lifting mechanism being configured to adjust a distance from the contact image sensor unit to an original surface of the light transmitting original and to an original surface of the reflecting sheet original, the lifting mechanism being configured to change a distance between the guide rail and the contact image sensor unit to one of a first predetermined distance and a second predetermined distance corresponding respectively to the light transmitting original and the reflecting sheet original to maintain a resolution of an image corresponding to the respective light transmitting original or the reflecting sheet original.

4. An image reading apparatus according to claim 3, wherein said lifting mechanism is a jack mechanism.

5. An image reading apparatus according to claim 1 or 3, wherein the distance from the original surface of said light transmitting original to the contact image sensor unit is stepwise adjusted.

* * * * *